United States Patent
Chu et al.

(10) Patent No.: US 10,160,633 B2
(45) Date of Patent: Dec. 25, 2018

(54) MEMS DEVICES AND FABRICATION METHODS THEREOF

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW); Te-Hao Lee, Taipei (TW); Chung-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 332 days.

(21) Appl. No.: 15/276,212

(22) Filed: Sep. 26, 2016

(65) Prior Publication Data

US 2017/0008758 A1    Jan. 12, 2017

Related U.S. Application Data

(62) Division of application No. 13/650,867, filed on Oct. 12, 2012, now Pat. No. 9,452,924.

(Continued)

(51) Int. Cl.
| | |
|---|---|
| *H01L 41/047* | (2006.01) |
| *H01L 41/113* | (2006.01) |
| *H01L 41/187* | (2006.01) |
| *B81B 3/00* | (2006.01) |
| *B81C 1/00* | (2006.01) |

(52) U.S. Cl.
CPC ........ *B81B 3/0054* (2013.01); *B81C 1/00238* (2013.01); *B81B 2201/0235* (2013.01); *B81B 2203/0307* (2013.01); *B81B 2203/04* (2013.01); *B81B 2207/07* (2013.01)

(58) Field of Classification Search
CPC ....... H01L 24/18; H01L 29/84; B81B 3/0054; B81B 2207/07; B81B 2203/04; B81B 2201/0235; B81B 2203/0307; B81C 1/00238

See application file for complete search history.

(56) References Cited

U.S. PATENT DOCUMENTS

| 6,384,473 B1 | 5/2002 | Peterson et al. |
| 6,936,491 B2 * | 8/2005 | Partridge ............ B81C 1/00301 438/48 |

(Continued)

FOREIGN PATENT DOCUMENTS

| TW | 201118036 | 6/2011 |
| TW | 201209897 | 3/2012 |
| TW | 201216342 | 4/2012 |

*Primary Examiner* — Joseph C Nicely
*Assistant Examiner* — Thai T Vuong
(74) *Attorney, Agent, or Firm* — Slater Matsil, LLP

(57) ABSTRACT

A device includes a carrier having a plurality of cavities, a micro-electro-mechanical system (MEMS) substrate bonded on the carrier, wherein the MEMS substrate comprises a first side bonded on the carrier, a moving element over a bottom electrode, wherein the bottom electrode is formed of polysilicon and a second side having a plurality of bonding pads and a semiconductor substrate bonded on the MEMS substrate, wherein the semiconductor substrate comprises a top electrode and the first moving element is between the top electrode and the bottom electrode.

20 Claims, 42 Drawing Sheets

Related U.S. Application Data

(60) Provisional application No. 61/660,589, filed on Jun. 15, 2012.

(56) References Cited

U.S. PATENT DOCUMENTS

| | | | |
|---|---|---|---|
| 7,615,833 B2 | 11/2009 | Larson, III et al. | |
| 7,767,484 B2 | 8/2010 | Ayazi | |
| 8,350,346 B1* | 1/2013 | Huang | B81B 3/0051 |
| | | | 257/414 |
| 2004/0121506 A1 | 6/2004 | Gogoi | |
| 2005/0227401 A1 | 10/2005 | Lee et al. | |
| 2007/0140514 A1 | 6/2007 | Pedersen | |
| 2007/0281381 A1 | 12/2007 | Ayazi | |
| 2008/0053236 A1 | 3/2008 | Gogoi et al. | |
| 2008/0128901 A1 | 6/2008 | Zurcher et al. | |
| 2008/0224241 A1 | 9/2008 | Inaba et al. | |
| 2008/0272867 A1 | 11/2008 | Cohn et al. | |
| 2008/0283943 A1* | 11/2008 | Dekker | B81C 1/00293 |
| | | | 257/415 |
| 2009/0154734 A1 | 6/2009 | Jeong et al. | |
| 2009/0190782 A1 | 7/2009 | Suzuki et al. | |
| 2009/0309171 A1 | 12/2009 | Schrank | |
| 2009/0309173 A1 | 12/2009 | Nakatani et al. | |
| 2010/0072561 A1 | 3/2010 | Lee et al. | |
| 2010/0072860 A1 | 3/2010 | Kim et al. | |
| 2010/0096714 A1 | 4/2010 | Nakatani | |
| 2010/0207217 A1 | 8/2010 | Zuninga-Ortiz et al. | |
| 2010/0276766 A1 | 11/2010 | Tang et al. | |
| 2010/0308424 A1 | 12/2010 | Wu et al. | |
| 2010/0320548 A1 | 12/2010 | Tsau et al. | |
| 2011/0049652 A1* | 3/2011 | Wu | B81C 1/00269 |
| | | | 257/417 |
| 2011/0126632 A1 | 6/2011 | McNeil et al. | |
| 2011/0316099 A1 | 12/2011 | Dunbar, III et al. | |
| 2012/0038372 A1 | 2/2012 | Reinmuth et al. | |
| 2012/0043627 A1* | 2/2012 | Lin | B81B 7/02 |
| | | | 257/415 |
| 2012/0061776 A1 | 3/2012 | Cheng et al. | |
| 2012/0098074 A1* | 4/2012 | Lin | B81C 1/00333 |
| | | | 257/414 |
| 2012/0119311 A1 | 5/2012 | Akhlaghi Esfahany et al. | |
| 2012/0248931 A1 | 10/2012 | Reinmuth | |
| 2012/0267773 A1 | 10/2012 | Ebefors et al. | |

\* cited by examiner

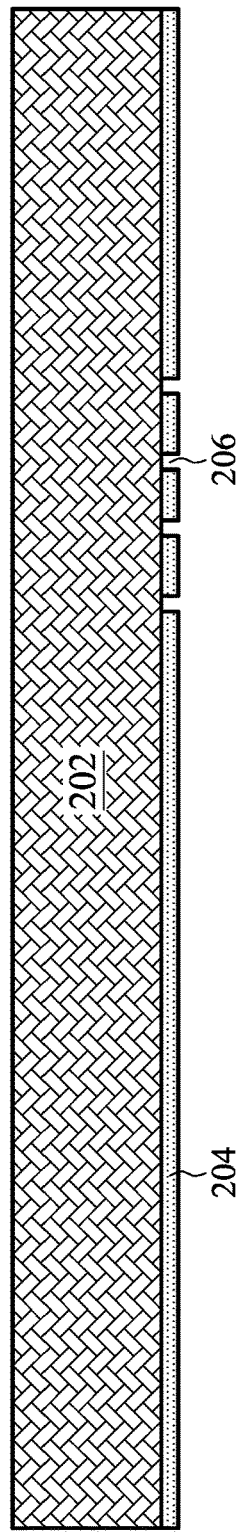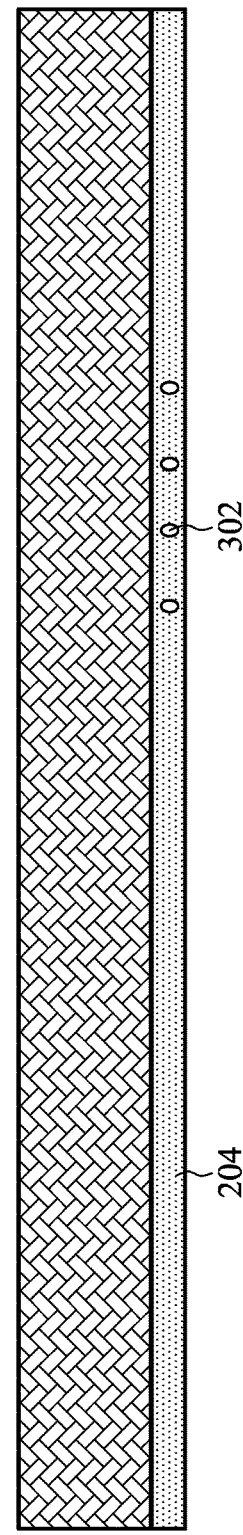
Figure 2
Figure 3

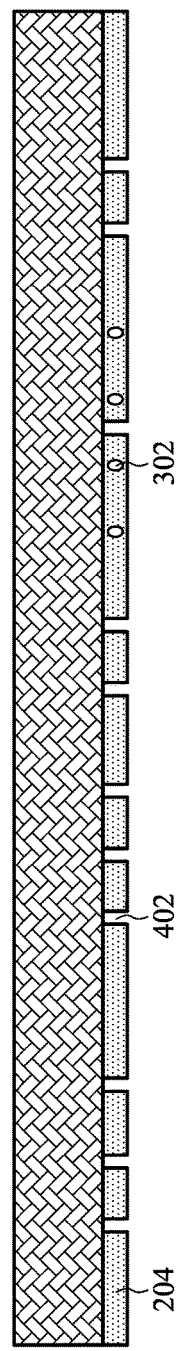
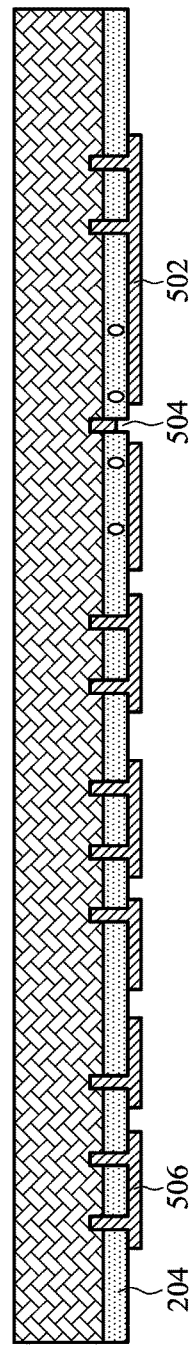
Figure 4
Figure 5

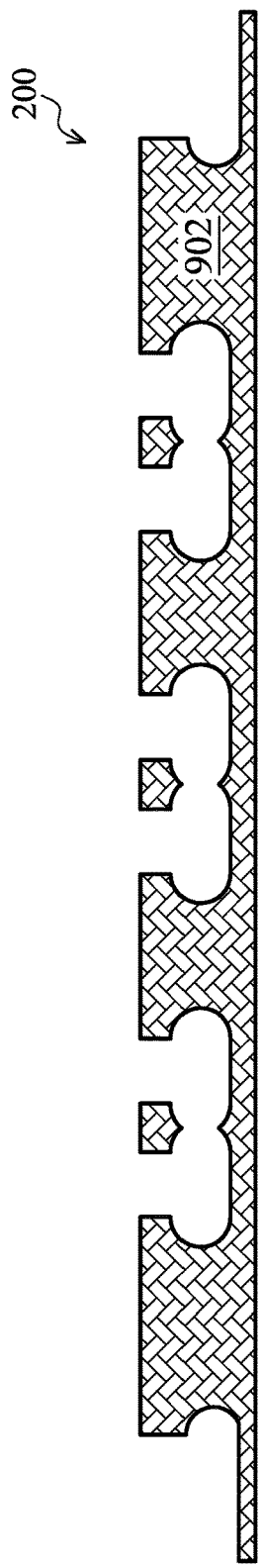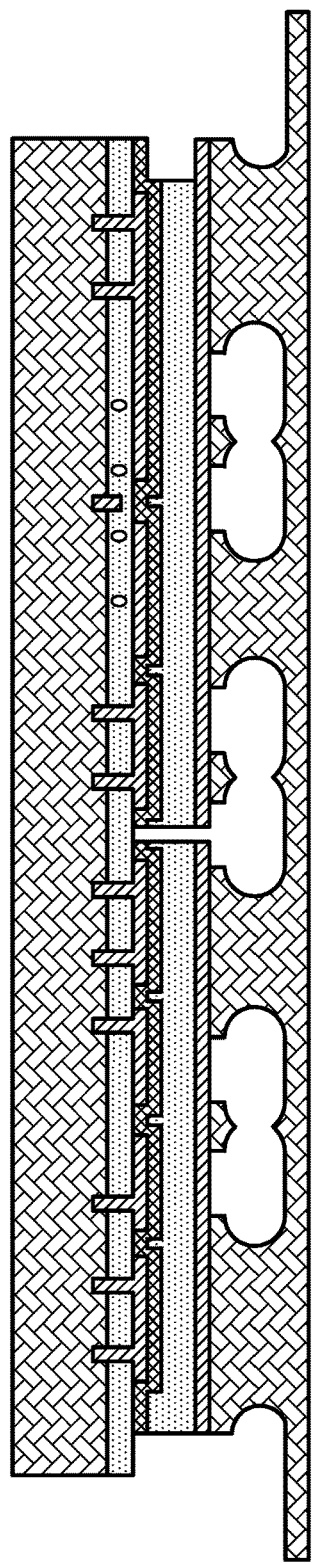
Figure 13
Figure 14

MEMS DEVICES AND FABRICATION METHODS THEREOF

This is a divisional application of U.S. application Ser. No. 13/650,867, entitled "MEMS Devices and Fabrication Methods Thereof" which was filed on Oct. 12, 2012 which claims the benefit of U.S. Provisional Application Ser. No. 61/660,589, entitled "MEMS Devices and Fabrication Methods Thereof" which was filed on Jun. 15, 2012, both of which are hereby incorporated herein by reference.

BACKGROUND

Micro-electro-mechanical systems (MEMS) are the technology of forming micro-structures with mechanical and electronic features. The MEMS device may comprise a plurality of elements (e.g., movable elements) for achieving mechanical functionality. In addition, the MEMS device may comprise a variety of sensors that sense various mechanical signals such as pressure, inertial forces and the like, and convert the mechanical signals into their corresponding electrical signals.

For example, a MEMS device having an accelerometer may comprise a proof mass, which is attached to the structure of the MEMS device. In response to the influence of external accelerations, the proof mass may deflect from its neutral position and move relative to the structure of the MEMS device. A sensor is employed to detect the relative motion between the proof mass and the structure of the MEMS device. In addition, the sensor may generate an electrical signal proportional to the motion strength of the proof mass.

In order to reduce the cost of manufacturing and packaging of MEMS systems, MEMS systems may comprise both micromechanical devices and electronic circuits. More particularly, the micromechanical devices and the electronic circuits such as complementary metal oxide semiconductor (CMOS) devices may be fabricated in the same manufacturing process and both devices may be bonded together through suitable bonding techniques such as eutectic bonding and the like.

MEMS applications include motion sensors, pressure sensors, printer nozzles and the like. Other MEMS applications include inertial sensors such as accelerometers for measuring linear acceleration and gyroscopes for measuring angular velocity. Moreover, MEMS applications may extend to optical applications such as movable mirrors, and radio frequency (RF) applications such as RF switches and the like.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 illustrates a cross-sectional view of a semiconductor device having a plurality of openings in a dielectric layer formed over a substrate in accordance with an embodiment;

FIG. 3 is a cross sectional view of the semiconductor device illustrated in FIG. 2 after an oxide deposition process has been applied to the dielectric layer side of the wafer in accordance with an embodiment;

FIG. 4 illustrates a cross sectional view of the semiconductor device shown in FIG. 3 after a plurality of opening are formed in the dielectric layer in accordance with an embodiment;

FIG. 5 illustrates a cross sectional view of the semiconductor device shown in FIG. 4 after a polysilicon layer is formed on the dielectric layer in accordance with an embodiment;

FIG. 13 illustrates a cross sectional view of the semiconductor device shown in FIG. 12 after an oxide removal process is applied to the carrier;

FIG. 14 illustrates a cross sectional view of a semiconductor device having a MEMS device stacked on top of a carrier;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained in detail with reference to the accompanying drawings.

Figure 1A:
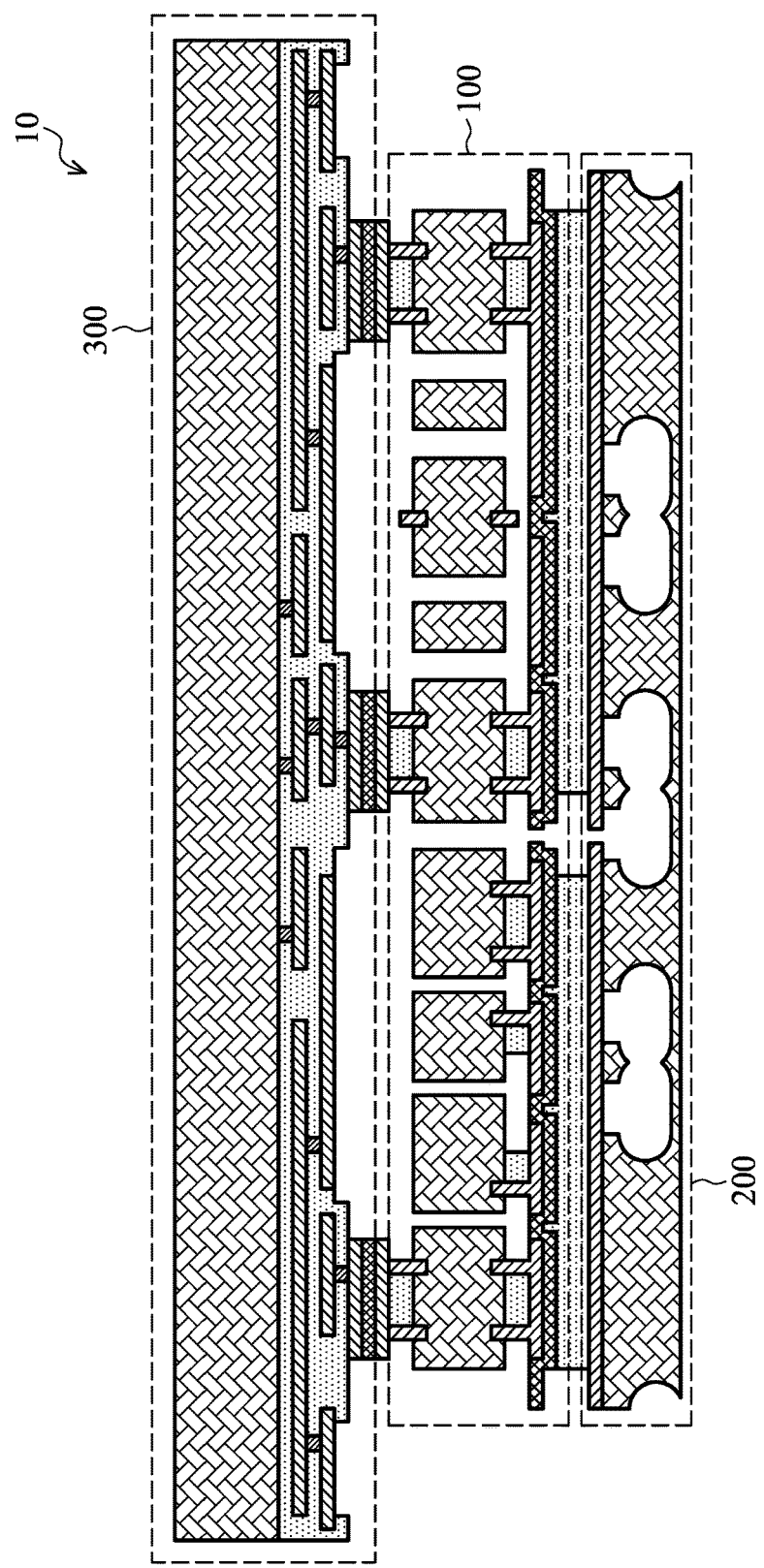
FIG. 1A illustrates a cross-sectional view of a MEMS in accordance with an embodiment.

FIG. 1A illustrates a cross-sectional view of a MEMS in accordance with an embodiment. The MEMS 10 includes a MEMS device 100, a carrier 200 and a CMOS device 300. As shown in FIG. 1, the MEMS device 100 is sandwiched between the carrier 200 and the CMOS device 300. Suitable bonding techniques such as fusion bonding, eutectic bonding and the like may be employed to bond the MEMS device 100, the carrier 200 and the CMOS device 300 together.

The CMOS device 300 may include a substrate. In accordance with an embodiment, the substrate of the CMOS device 300 may be formed of silicon. Alternatively, the substrate of the CMOS device 300 may be formed of other semiconductor materials including silicon germanium (SiGe), silicon carbide and the like. Furthermore, other substrates that may be used include multi-layered substrates, gradient substrates, hybrid orientation substrates and any combinations thereof.

The CMOS device 300 may include active and passive devices (not shown). As one of ordinary skill in the art will recognize, a wide variety of active and passive devices such as transistors, capacitors, resistors, combinations of these, and the like may be used to generate the structural and functional requirements of the design for the MEMS 10. The active and passive devices may be formed using any suitable methods.

The MEMS device 100 may comprise a substrate having MEMS features and functionality. The substrate of the MEMS device 100 may have similar materials as the substrate of the CMOS device 300, although the substrate of the CMOS device 300 and the MEMS device 100 are not necessary to be the same material. The CMOS device 300 is bonded on top of the MEMS device 100. According to an embodiment, the bonding process may be implemented by using eutectic bonding. In other embodiments, the bonding process may include other suitable bonding techniques such as fusion boding, thermo-compression bonding, direct bonding, glue bonding or the like.

The carrier 200 includes a substrate having a plurality of cavities. In accordance with an embodiment, the substrate of the carrier 200 may be formed of silicon. Alternatively, the carrier 200 may be formed of suitable materials including a ceramic substrate, a quartz substrate and the like.

The carrier 200 may include active and passive devices. As one of ordinary skill in the art will recognize, a wide variety of active and passive devices such as transistors, capacitors, resistors, combinations of these, and the like may be used to generate the structural and functional requirements of the design for the MEMS 10. The active and passive devices may be formed using any suitable methods.

As shown in FIG. 1A, the MEMS device 100 as well as the CMOS device 300 are boned together and further bonded on top of the carrier 200. In accordance with an embodiment, the MEMS device 100 and the carrier 200 may be bonded together through suitable bonding techniques such as fusion bonding.

Figure 1B:
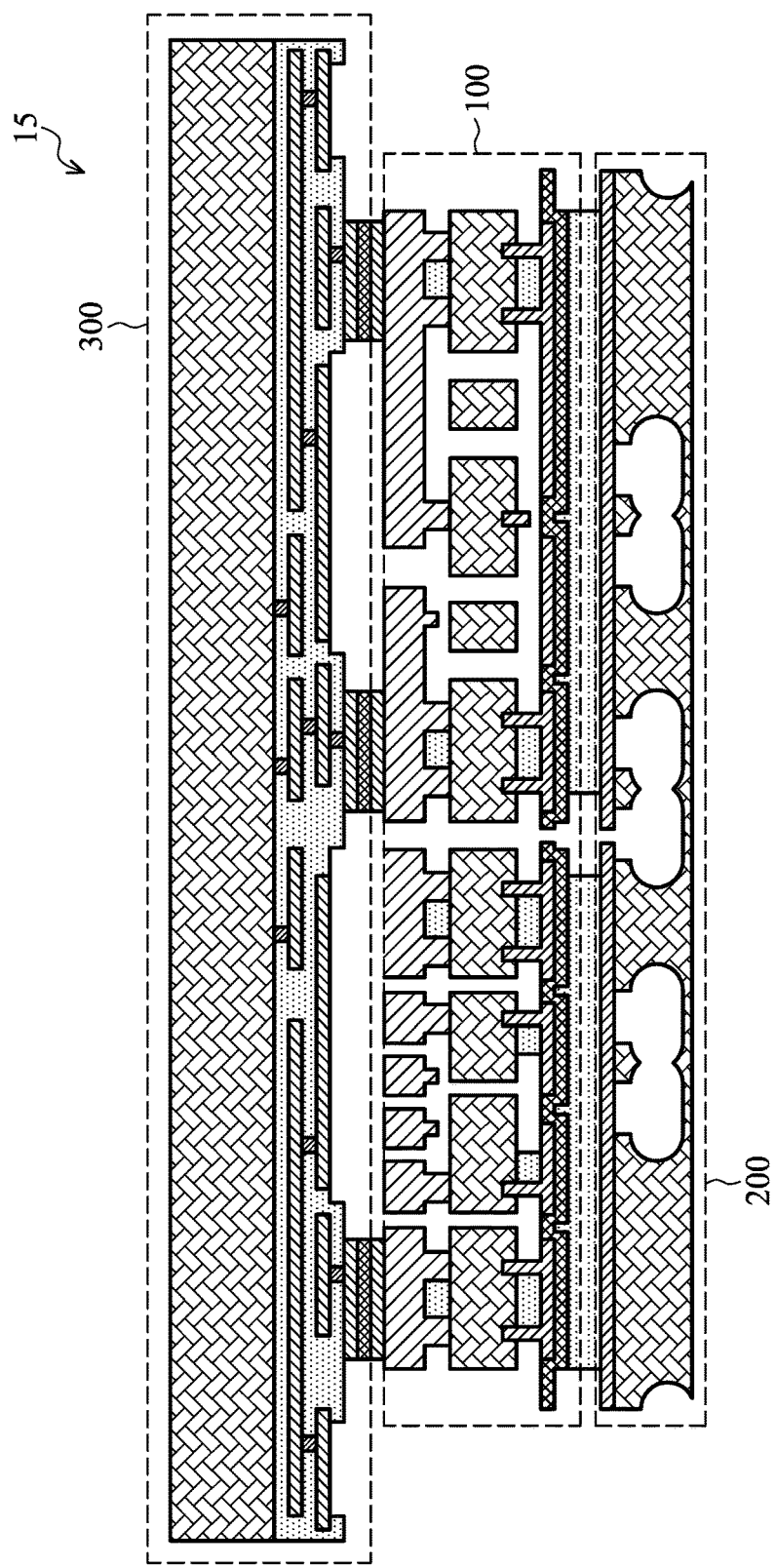
FIG. 1B illustrates a cross-sectional view of another MEMS in accordance with an embodiment.

FIG. 1B illustrates a cross sectional view of another MEMS in accordance with an embodiment. The structure of the MEMS 15 is similar to that of the MEMS 10 shown in FIG. 1A except that one additional thin structure layer is formed between the MEMS device 100 and the CMOS device 300. One advantageous feature of having the thin structure layer is that soft out-of-plane structures such as springs may be formed by the thin structure layer. Such a thin structure layer helps to improve the dimension of the MEMS 15 while keeping easy movements along the Z axis of the MEMS 15.

FIGS. 2-8 illustrate intermediate steps of fabricating a MEMS device in accordance with an embodiment. FIG. 2 illustrates a cross-sectional view of a semiconductor device having a plurality of openings in a dielectric layer formed over a substrate in accordance with an embodiment. The substrate 202 may be formed of silicon, silicon germanium, silicon carbide or the like. The substrate 202 may be formed of low resistive silicon. Alternatively, the substrate 202 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

A dielectric layer 204 is formed on top of the substrate 202. The dielectric layer 204 may be formed, for example, of a low-K dielectric material, such as silicon oxide. The dielectric layer 204 may be formed by any suitable deposition techniques known in the art, such as spinning, chemical vapor deposition (CVD) and plasma enhanced chemical vapor deposition (PECVD) and the like.

FIG. 2 further illustrates the patterning of the dielectric layer 204 to form openings 206 in the dielectric layer 204. The patterning process may be accomplished by depositing a commonly used mask material (not shown) such as photoresist over the dielectric layer 202. The mask material is then patterned and the dielectric layer 202 is etched in accordance with the pattern to form the openings 206.

FIG. 3 is a cross sectional view of the semiconductor device illustrated in FIG. 2 after an oxide deposition process has been applied to the dielectric layer side of the substrate in accordance with an embodiment. As shown in FIG. 3, the oxide may be employed to seal off the upper terminals of the openings 206. The oxide deposition may be formed using a deposition process such as CVD or the like. More particularly, by controlling the deposition process, the material of the oxide layer may be deposited in a non-conformable manner. In other words, the materials of the oxide layer may build up on the upper terminal of the opening faster than along the sidewalls and the bottom of the opening. This process leads to the formation of an overhang at the edge of the upper terminal of the opening and, as the deposition process continues, the overhangs will merge, thereby sealing off the upper terminal of the opening to form a plurality of seams 302.

As shown in FIG. 3, the seams 302 are embedded in the oxide layer 204. In accordance with an embodiment, the oxide layer 204 is a sacrificial oxide layer of a MEMS device. During a releasing process of the MEMS device, the seams 302 help to reduce the releasing time of the MEMS device.

FIG. 4 illustrates a cross sectional view of the semiconductor device shown in FIG. 3 after a plurality of opening are formed in the dielectric layer in accordance with an embodiment. A patterning process may be applied to the dielectric layer 204 to form a plurality of openings 402. The patterning process may be accomplished by depositing a commonly used mask material (not shown) such as photoresist over the dielectric layer 204. The mask material is then patterned and the dielectric layer 204 is etched in accordance with the pattern.

According to the fabrication processes of the MEMS device 100, the oxide side of the substrate is thinned until a desired thickness is achieved. In accordance with an embodiment, the thickness of the oxide layer 204 is in a range from about 0.5 um to about 5 um. The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the oxide side of the substrate and a grinding pad (not shown) is used to grind away a portion of the oxide layer 204 of the substrate until the desired thickness is achieved.

FIG. 5 illustrates a cross sectional view of the semiconductor device shown in FIG. 4 after a polysilicon layer is formed on the dielectric layer in accordance with an embodiment. The polysilicon layer 502 is formed on the dielectric layer 204 through suitable fabrication techniques such as CVD. The polysilicon layer 502 may be of a thickness in a range from about 0.1 um to about 2 um.

The polysilicon layer 502 may be patterned to form functional elements such as electrodes and routing structures (e.g., polysilicon structure 506). In addition, an over-etch process may be employed to form mechanical bumps (e.g., bump 504). It should be noted the polysilicon structure 506 may function as bottom electrodes of the MEMS device. As shown in FIG. 5, the electrodes are further coupled to the substrate through a plurality of polysilicon vias. One advantageous feature of having the polysilicon layer 502 shown in FIG. 5 is that the electrical connection between the bottom electrodes and the substrate can be formed without a deep silicon etching process.

It should be noted that while a single polysilicon layer 502 is illustrated, those skilled in the art will recognize that multiple polysilicon layers could be employed. Alternatively, an appropriate conducting material could likewise be employed for form the electrodes and routing structures shown in FIG. 5.

Figure 6:
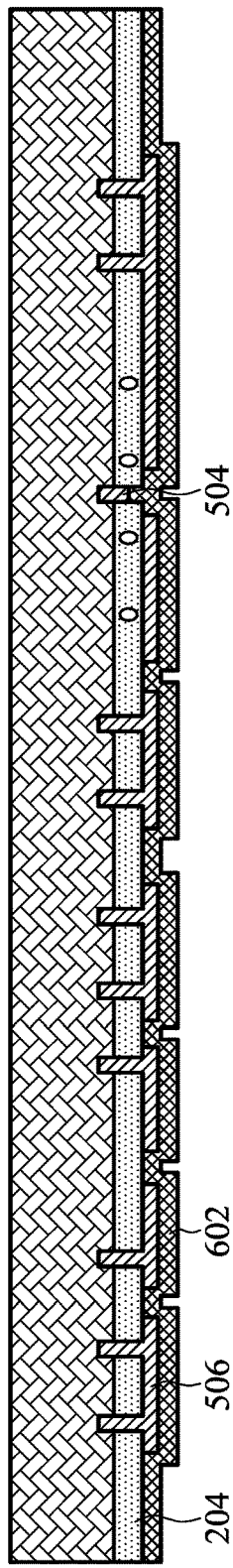
FIG. 6 illustrates a cross sectional view of the semiconductor device shown in FIG. 5 after a low stress nitride layer is formed on the dielectric layer as well as the polysilicon layer in accordance with an embodiment.

FIG. 6 illustrates a cross sectional view of the semiconductor device shown in FIG. 5 after a vapor hydrogen fluoride (HF) stop layer is formed on the dielectric layer as well as the polysilicon layer in accordance with an embodiment. Before the vapor HF stop layer is deposited on the semiconductor device, another oxide deposition process may be applied to the semiconductor device. In particular, an oxide layer is deposited so that the electrodes 506 as well as the mechanical bumps 504 are covered by the oxide layer. An etch-back process is applied subsequently. As a result, the surface of the electrode 506 is exposed and the mechanical bump 504 is still covered by the oxide layer.

After the etching-back process has been applied to the semiconductor device shown in FIG. 6, the vapor HF stop layer may be formed on the polysilicon side of the semiconductor device. In accordance with an embodiment, the vapor HF stop layer may be a low stress nitride layer. Alternatively, the vapor HF stop layer may be formed of other suitable materials such as SiC, AlN, $Al_2O_3$ and the like. Throughout the description, the vapor HF stop layer may be alternatively referred to as a low stress nitride layer. The low stress nitride layer 602 may be deposited on dielectric layer 204 through suitable fabrication techniques such as CVD, Low-Pressure CVD (LPCVD) and the like.

Figure 7:
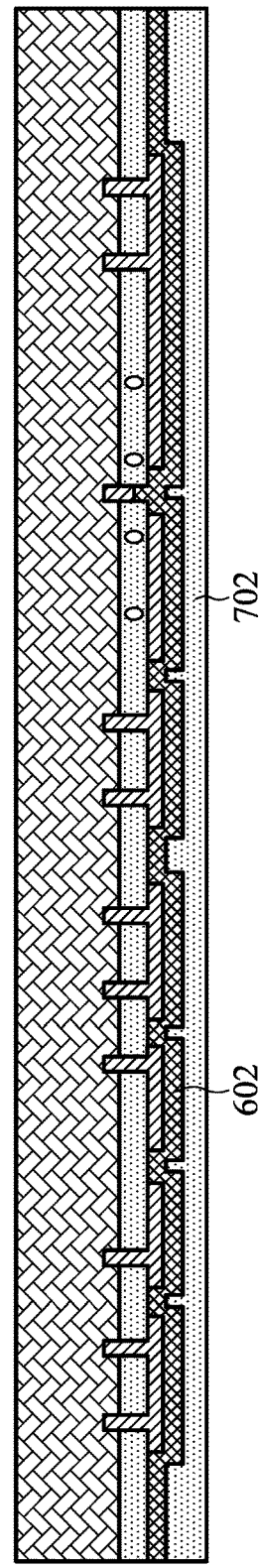
FIG. 7 illustrates a cross sectional view of the semiconductor device shown in FIG. 6 after an oxide deposition process is applied to the low stress nitride layer in accordance with an embodiment.

FIG. 7 illustrates a cross sectional view of the semiconductor device shown in FIG. 6 after an oxide deposition process is applied to the low stress nitride layer in accordance with an embodiment. An oxide layer 702 is further formed on the low stress nitride layer 602, as illustrated in FIG. 7. The oxide layer 702 may be formed by using well known deposition techniques such as CVD, or using some other conventional techniques. The oxide layer 702 has a flat surface. If a sufficiently flat surface is not obtained by the oxide deposition or formation process, flatness can be achieved by employing a CMP process or an etch-back process, as are known in the art.

Figure 8:
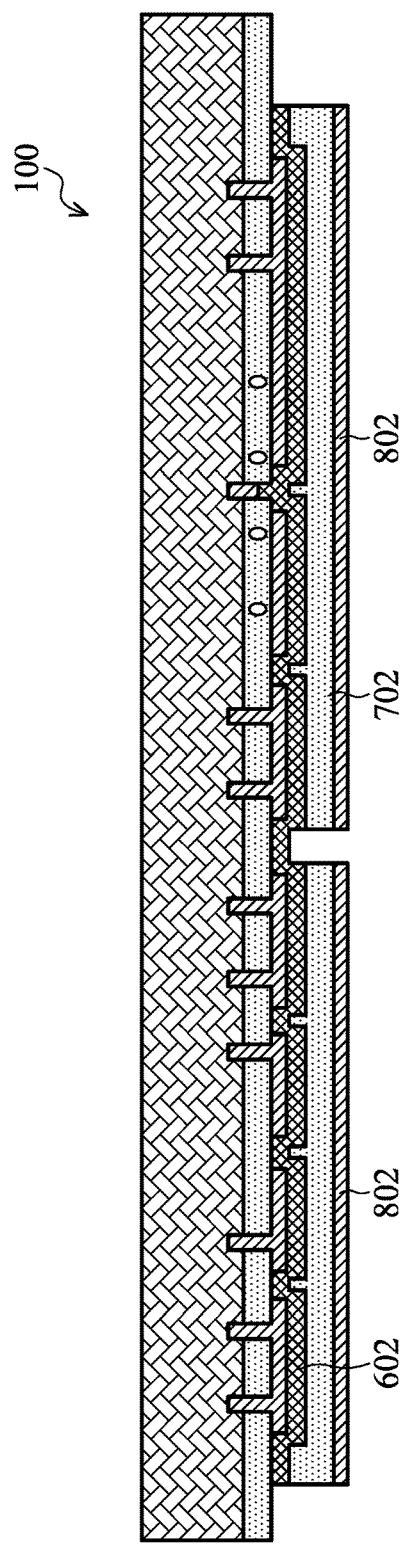
FIG. 8 illustrates a cross sectional view of the semiconductor device shown in FIG. 7 after a polysilicon layer is formed on the oxide layer in accordance with an embodiment.

FIG. 8 illustrates a cross sectional view of the semiconductor device shown in FIG. 7 after a polysilicon layer is formed on the oxide layer in accordance with an embodiment. A bonding interface layer 802 is deposited over the oxide layer 702. In accordance with an embodiment, the bonding interface layer may be formed of polysilicon. Alternatively, the bonding interface layer 802 may be formed of any suitable bonding materials such as silicon, amorphous silicon, silicon doped with impurities, any combinations thereof and the like. The polysilicon layer 802 is formed on oxide layer 702 through suitable fabrication techniques such as CVD, PVD and the like. The polysilicon layer 802, the oxide layer 702 and the low stress nitride layer 602 may be patterned to form the channels connected to air cavities (not shown) of a MEMS device.

Figure 9:
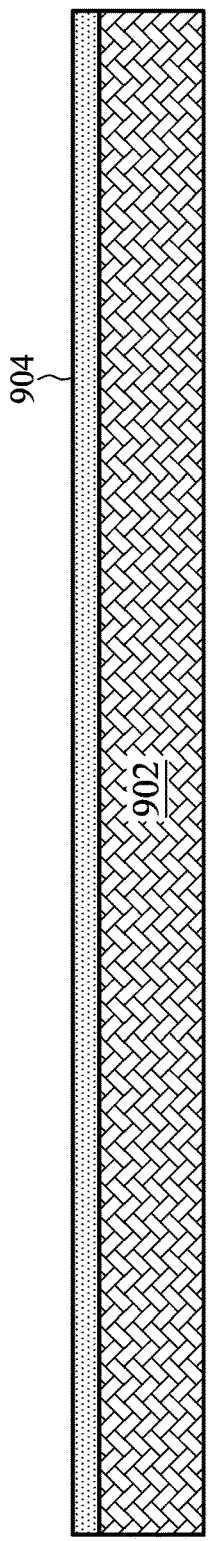
FIG. 9 illustrates a cross sectional view of a carrier in accordance with an embodiment.

FIGS. 9-13 illustrate intermediate steps of fabricating a carrier in accordance with an embodiment. FIG. 9 illustrates a cross sectional view of a carrier in accordance with an embodiment. The carrier may comprise a silicon substrate 902. As shown in FIG. 9, a dielectric layer 904 may be formed on the top surface of the substrate 902. In accordance with an embodiment, the dielectric layer 904 may be a thermal oxide layer formed by performing a thermal oxidation on the carrier.

Figure 10:
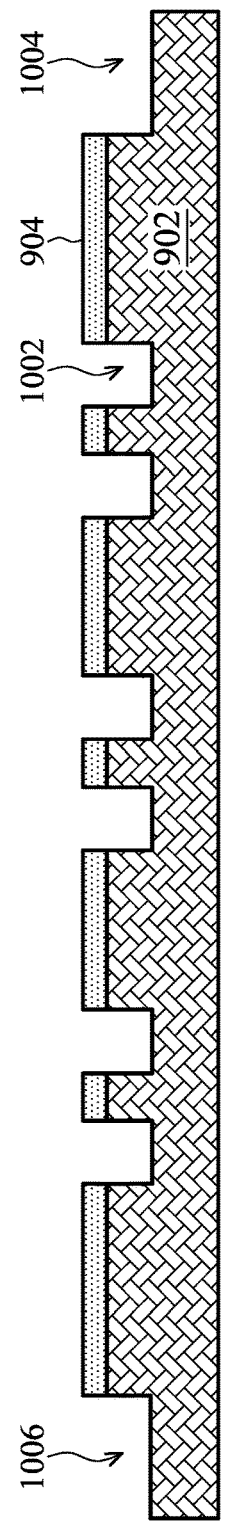
FIG. 10 illustrates a cross sectional view of the semiconductor device shown in FIG. 9 after an etching process is applied to the carrier and deep openings are formed in the substrate of the carrier in accordance with an embodiment.

FIG. 10 illustrates a cross sectional view of the semiconductor device shown in FIG. 9 after an etching process is applied to the carrier and deep openings are formed in the substrate of the carrier in accordance with an embodiment. As shown in FIG. 10, a Deep Reactive-Ion Etching (DRIE) process is performed to form deep openings 1002 in the substrate 902. It should be noted that due to etching loading effects, the wide openings at the edges of the cell (e.g., openings 1004 and 1006) are deeper than the narrow openings in the center and middle of the cell (e.g., opening 1002).

Figure 11:
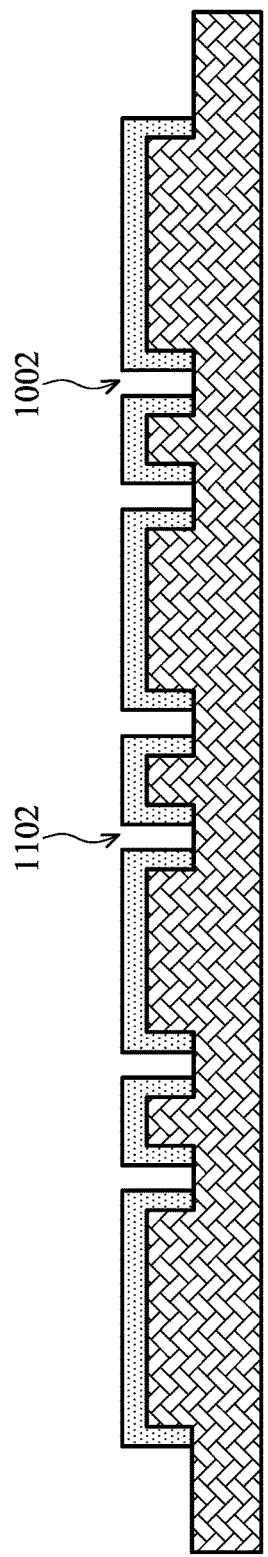
FIG. 11 illustrates a cross sectional view of the semiconductor device shown in FIG. 10 after an oxide layer is deposited in the openings and on the surface of the semiconductor device in accordance with an embodiment.

FIG. 11 illustrates a cross sectional view of the semiconductor device shown in FIG. 10 after an oxide layer is deposited in the openings and on the surface of the semiconductor device in accordance with an embodiment. The oxide layer 1102 may be formed by any suitable oxidation processes such as wet or dry thermal oxidation process, CVD or the like. An etching process, such as a reactive ion etch (RIE) or other dry etch, an anisotropic wet etch, or any other suitable anisotropic etch or patterning process, is performed to remove the bottom portion of the oxide layer 1102. As a result, the bottom portions of the openings 1002 are free from oxide. As shown in FIG. 11, the sidewalls of the openings are protected by the oxide layer 1102. It should be noted that the protection layer formed on the sidewalls can be replaced by other materials such as photoresist, polymer and the like.

Figure 12:
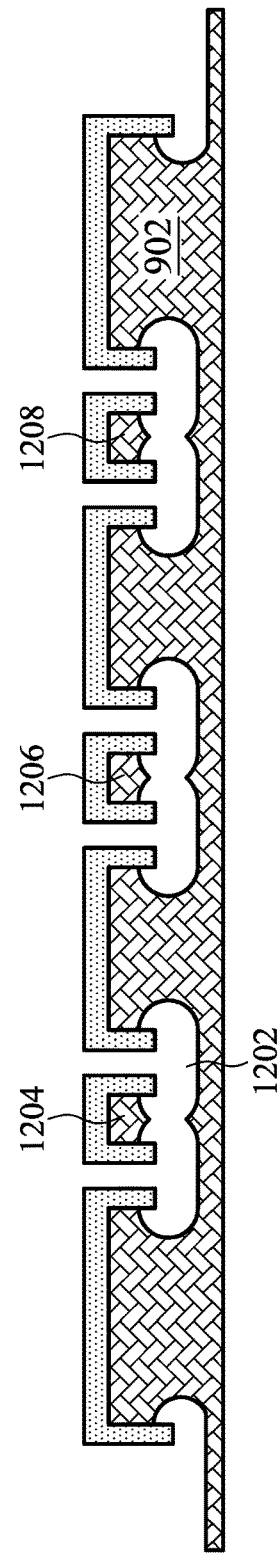
FIG. 12 illustrates a cross sectional view of the semiconductor device shown in FIG. 11 after an etching process is applied to the carrier in accordance with an embodiment.

FIG. 12 illustrates a cross sectional view of the semiconductor device shown in FIG. 11 after an etching process is applied to the carrier in accordance with an embodiment. Portions of the substrate 902 may be removed to form cavities 1202 by an etching process. The etching process may be any suitable etching processes such as isotropic silicon etching processes. The protection layers on the sidewalls of the opening 1002 (shown in FIG. 11) prevent the etching process from damaging the silicon membranes 1204, 1206 and 1208. The remained silicon membranes 1204, 1206 and 1208 help to improve the bonding ratio of a fusion bonding process, which will be described below with respect to FIG. 14.

FIG. 13 illustrates a cross sectional view of the semiconductor device shown in FIG. 12 after an oxide removal process is applied to the carrier in accordance with an embodiment. As shown in FIG. 13, the oxide layer shown in FIG. 12 has been removed through a suitable removal process such as a wet etch process. The removal process is applied to the top surface of the carrier until the substrate is exposed. It should be noted the oxide removal is an optional step. A fusion bonding process is capable of bonding a carrier with an oxide bonding interface layer with a MEMS device.

FIGS. 14-18 illustrate intermediate steps of bonding the MEMS device on top of the carrier in accordance with an embodiment. FIG. 14 illustrates a cross sectional view of a semiconductor device having a MEMS device stacked on top of a carrier. The MEMS device and the carrier may be bonded together through suitable bonding techniques such as fusion bonding, anodic bonding, eutectic bonding and the like. In accordance with an embodiment, the MEMS device and the carrier may be bonded together by a fusion bonding process between the bonding interface layer 802 (on MEMS device) and the top surface of the carrier.

Figure 15:
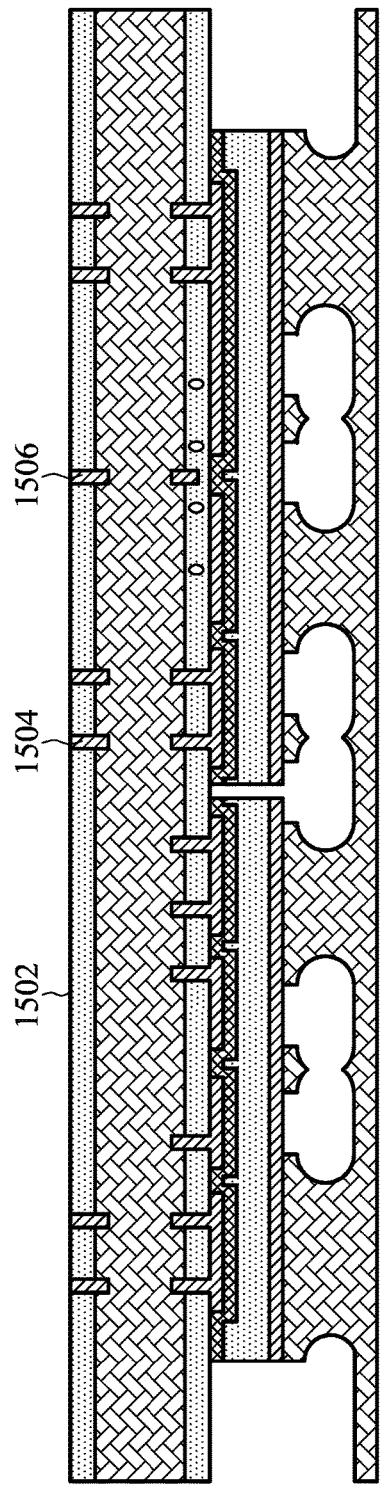
FIG. 15 illustrates a cross sectional view of the semiconductor device shown in FIG. 14 after a thinning process, an oxide deposition process and a polysilicon deposition process are performed to the MEMS device in accordance with an embodiment.

FIG. 15 illustrates a cross sectional view of the semiconductor device shown in FIG. 14 after a thinning process is applied to the top surface of the MEMS device in accordance with an embodiment. A grinding process may be performed on the top side of the MEMS device as shown in FIG. 15. The grinding process is performed until a desired thickness is achieved. In accordance with an embodiment, the MEMS device is of a thickness in a range from about 5 um to about 60 um.

An oxide layer 1502 is deposited on top of the MEMS device through suitable fabrication techniques such as CVD or the like. The oxide layer 1502 is then patterned according to the location of connection plugs 1504 and mechanical bumps 1506. An etching step is then performed to etch through the oxide layer 1502 to form a plurality of openings for the connection plugs 1504 and mechanical bumps 1506. A conductive layer (not shown) formed of polysilicon is deposited on top of the oxide layer 1502. The conductive material is filled into the openings to form contact plugs 1504 and mechanical bumps 1506. As shown in FIG. 15, the contact plugs 1504 are electrically coupled to the substrate. A CMP process may be employed to remove the conductive layer on top of the MEMS device. The CMP process is performed until the oxide layer 1502 is exposed.

Figure 16:
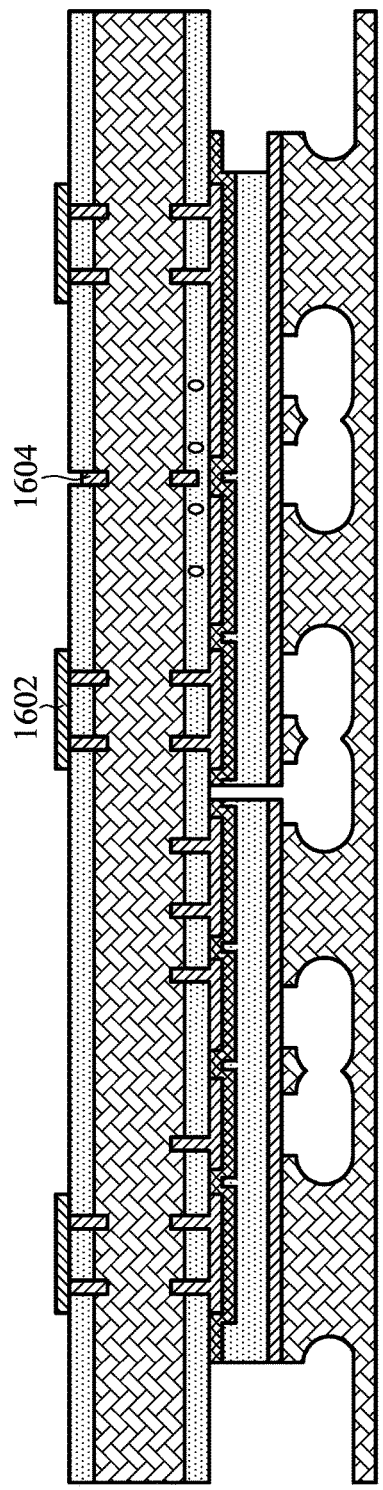
FIG. 16 illustrates the formation and patterning of a bonding material layer on top of the MEMS device in accordance with an embodiment.

FIG. 16 illustrates the formation and patterning of a bonding material layer on top of the MEMS device in accordance with an embodiment. The bonding material layer is formed over the oxide layer 1502. The bonding material 1602 may be made of aluminum copper, germanium, gold, the like, or a combination thereof. The bonding material 1602 may be formed using PVD, such as sputtering or evaporation, the like, a combination thereof, or other acceptable methods. The bonding material layer 1602 may be patterned using acceptable lithography techniques. In addition, an over-etching process may be employed to remove a portion of the poly 1506 to form the mechanical bump 1604 as shown in FIG. 16.

Figure 17:
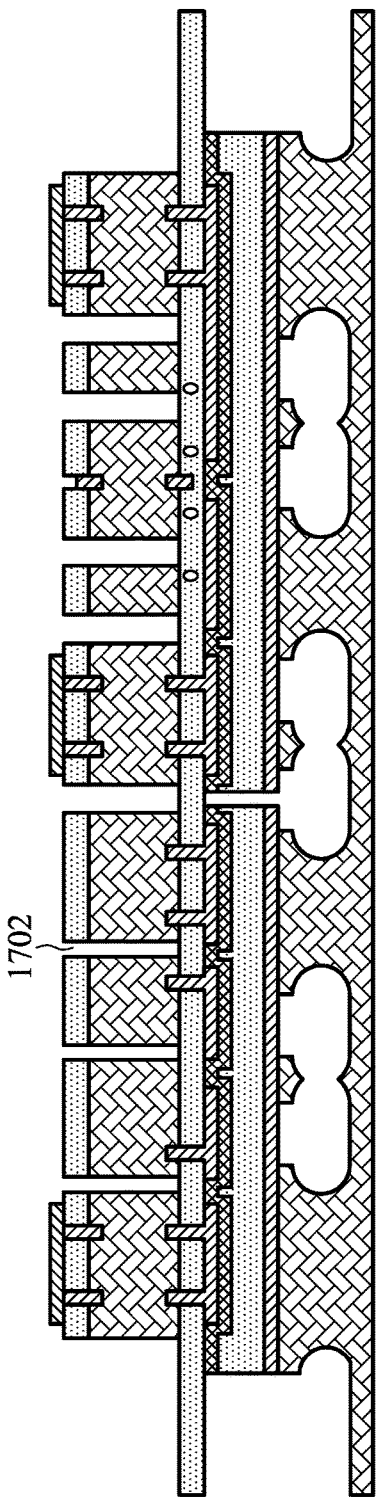
FIG. 17 illustrates a cross sectional view of the semiconductor device shown in FIG. 16 after the MEMS device's structure is defined in accordance with an embodiment.

FIG. 17 illustrates a cross sectional view of the semiconductor device shown in FIG. 16 after the MEMS device's structure is defined in accordance with an embodiment. Portions of the oxide layer and the substrate of the MEMS device are removed to define the MEMS structure. As shown in FIG. 17, the substrate of the MEMS device has been divided into several isolated regions by a plurality of deep openings 1702.

Figure 18:
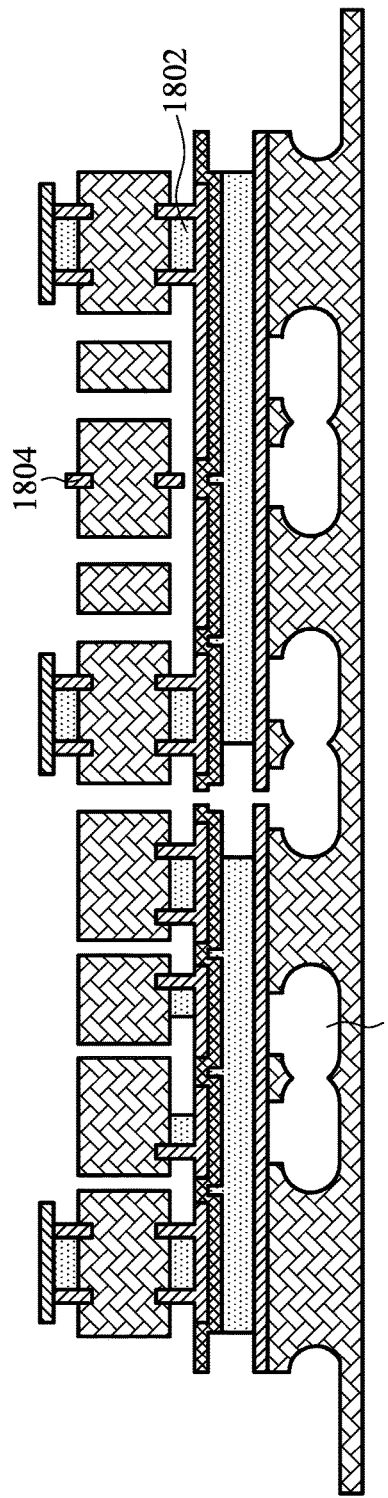
FIG. 18 illustrates a cross sectional view of the semiconductor device shown in FIG. 17 after a vapor HF process is applied to the MEMS device in accordance with an embodiment.

FIG. 18 illustrates a cross sectional view of the semiconductor device shown in FIG. 17 after a vapor HF process is applied to the MEMS device in accordance with an embodiment. The oxide layers of the MEMS device function as sacrificial oxide layers. The sacrificial oxide layers may be subject to a HF vapor etching process. As a result, portions of the sacrificial oxide layers are removed. It should be noted that the sacrificial oxide layers to be removed depend on the layout design.

As shown in FIG. 18, anchor regions such as anchor region 1802 may be protected by the polysilicon plugs. After the HF vapor etching process, sealed cavities of the carrier such as cavity 1806 are connected to the openings of the MEMS device. One advantageous feature of having a vapor HF etching process is that the dry releasing process from the HF vapor helps to reduce the occurrence of a well-known MEMS fabrication issue, namely the stiction problem.

Figure 19:
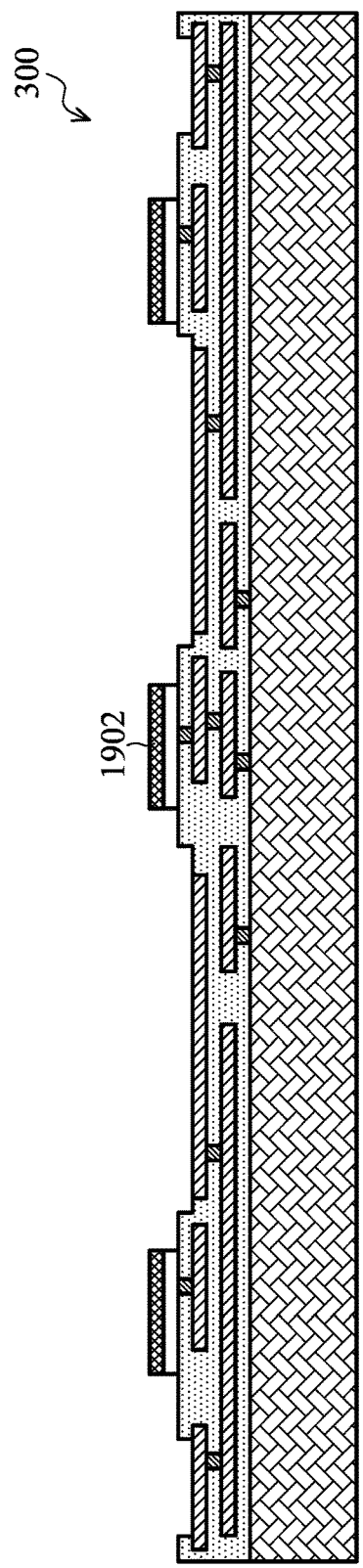
FIG. 19 illustrates the formation and patterning of a bonding material layer on the CMOS device in accordance with an embodiment.
Figure 20:
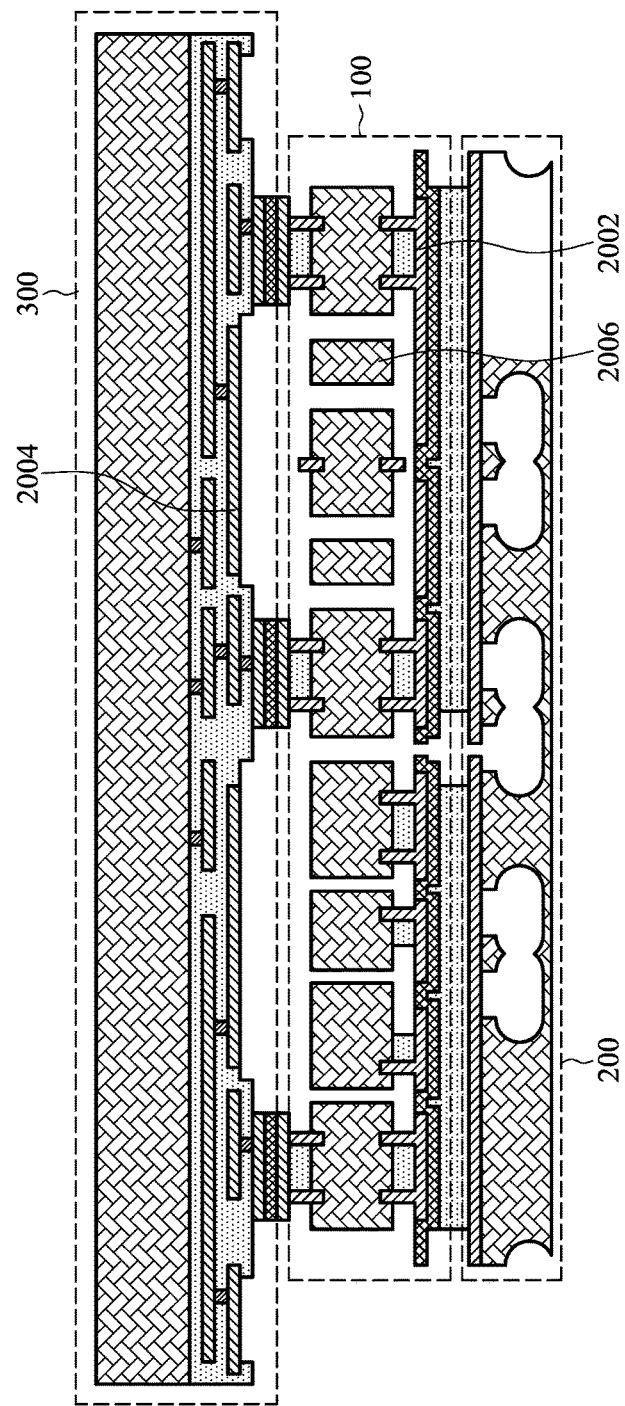
FIG. 20 illustrates a cross sectional view of a semiconductor device having a CMOS device stacked on top of a MEMS device in accordance with an embodiment.
Figure 21:
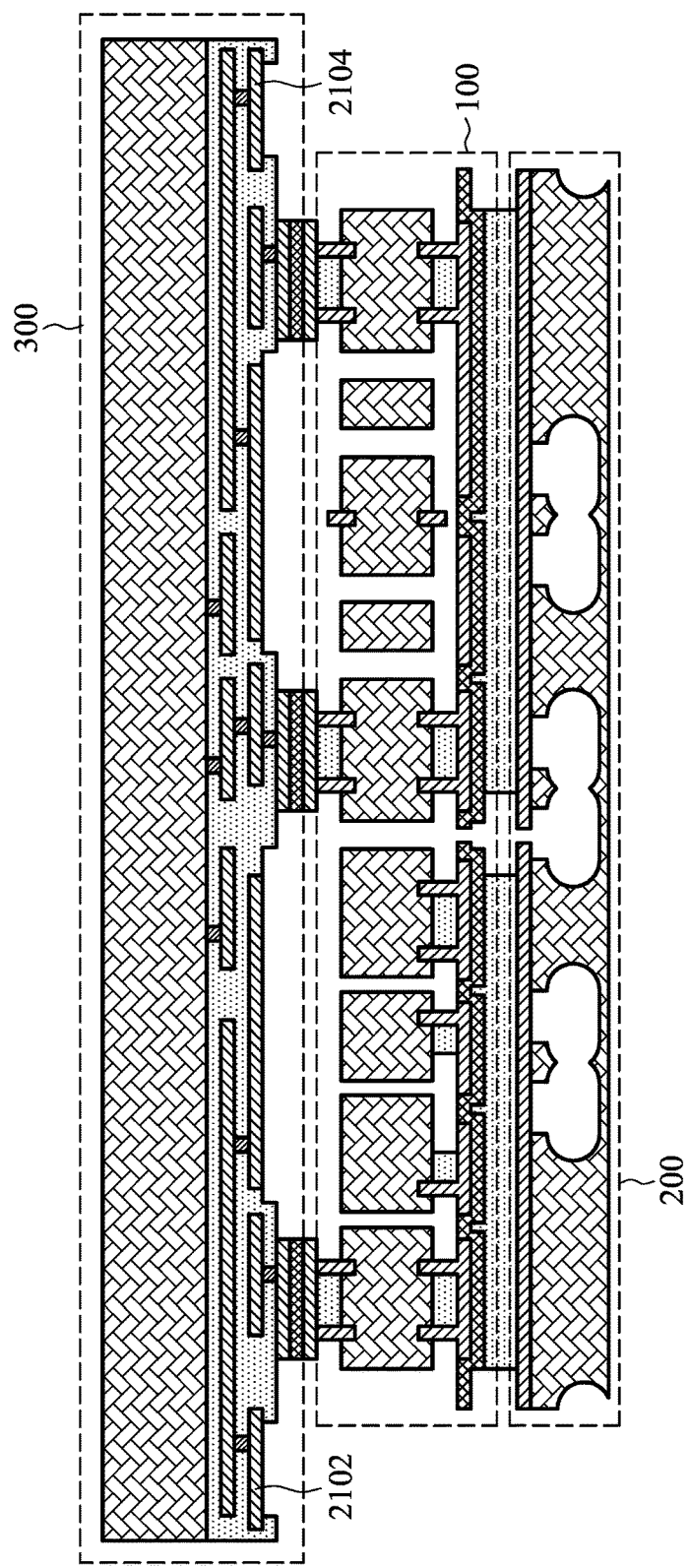
FIG. 21 illustrates a cross sectional view of the semiconductor device shown in FIG. 20 after a grinding process is applied to the semiconductor device in accordance with an embodiment.
Figure 22:
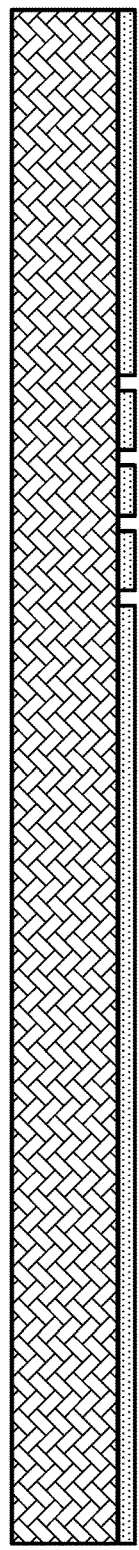
FIGS. 22-44 illustrate intermediate steps of fabricating a MEMS device in accordance with another embodiment.
Figure 23:
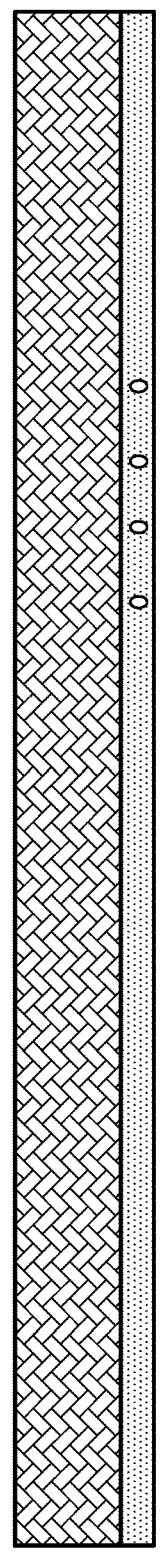
Figure 24:
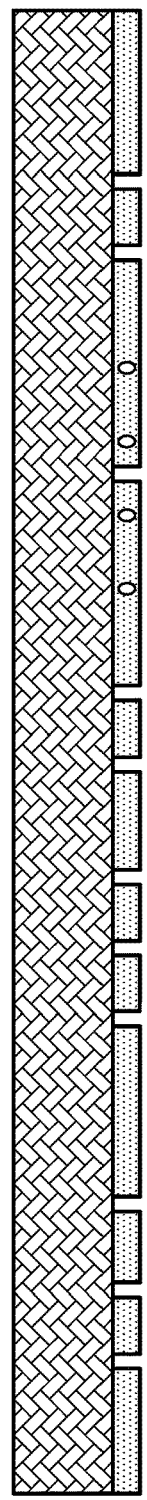
Figure 25:
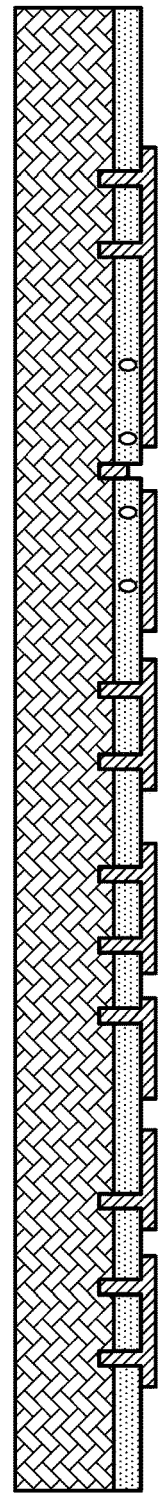
Figure 26:
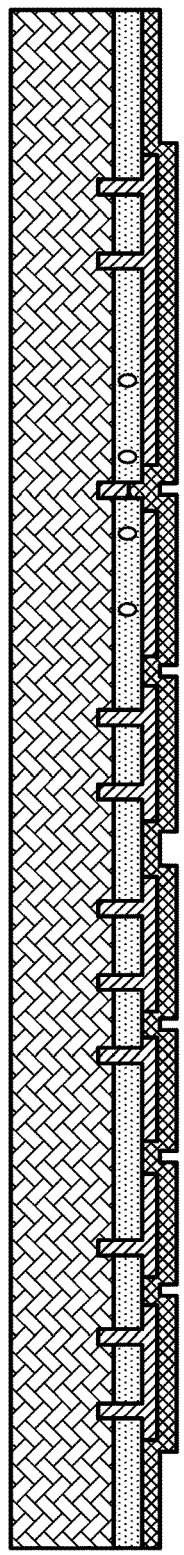
Figure 27:
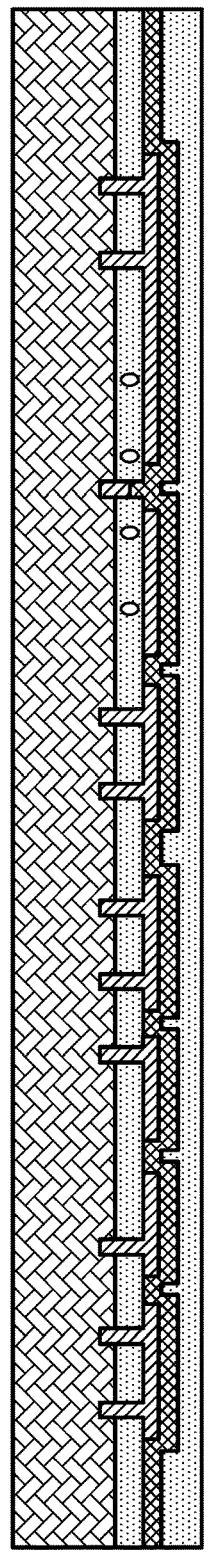
Figure 28:
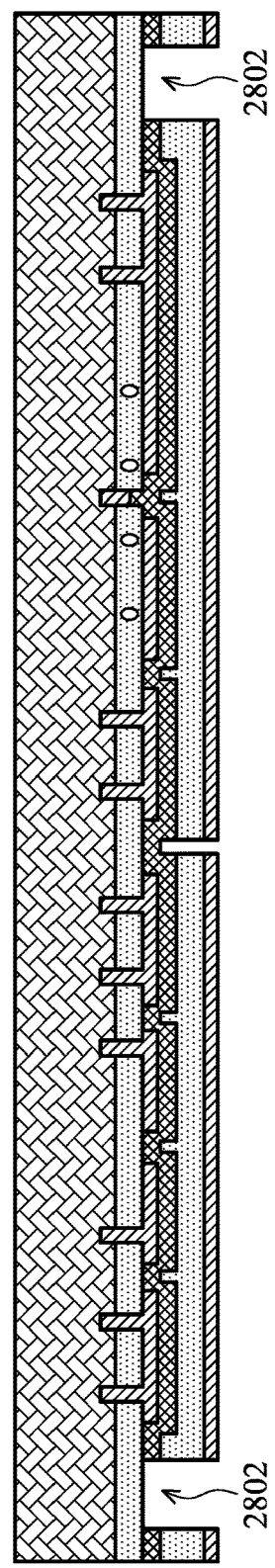
Figure 29:
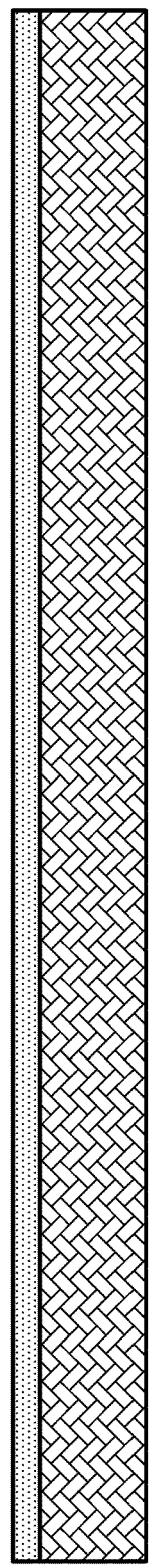
Figure 30:
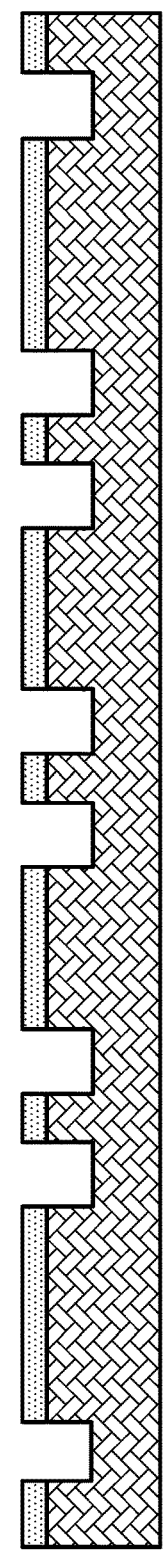
Figure 31:
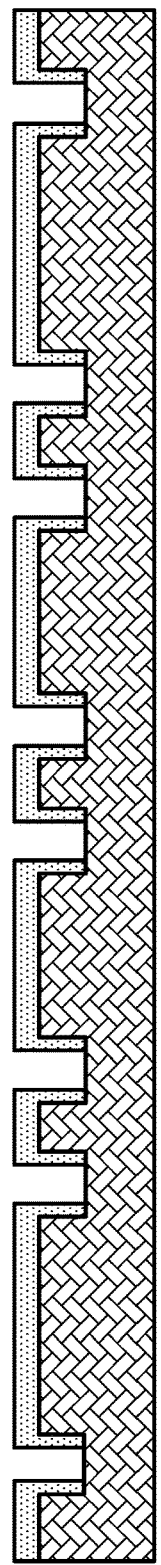

FIGS. 19-21 illustrate intermediate steps of bonding a CMOS device on top of the MEMS device in accordance with an embodiment. FIG. 19 illustrates the formation and patterning of a bonding material layer on the CMOS device in accordance with an embodiment. The CMOS device may comprise a substrate. The substrate may further comprise a variety of electrical circuits (not shown). The electrical circuits formed on the substrate may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner The bonding material layer 1902 is formed over the substrate of the CMOS device. In accordance with an embodiment, the bonding material layer 1902 may be made of aluminum copper, germanium, gold, the like, or a combination thereof. The bonding material layer 1902 may act as a eutectic bonding material for subsequent bonding processes. The bonding material 1902 may be formed using PVD or other acceptable methods, and may be patterned using acceptable lithography techniques.

FIG. 20 illustrates a cross sectional view of a semiconductor device having a CMOS device stacked on top of a MEMS device in accordance with an embodiment. The CMOS device 300 is bonded on top of the MEMS device 100. The two structures may be bonded together by eutectic bonding between the bonding material 1602 (on MEMS device 100) and bonding material 1902 (on CMOS device 300). As shown in FIG. 20, through the eutectic bonding process, movable elements (e.g., movable element 2006) may be located between a top electrode 2004 and a bottom electrode 2002.

In accordance with an embodiment, a bond force of larger than 30 kN and a temperature of larger than 400° C. can be applied to get a good bond strength. According to an embodiment, a vacuum chamber may be used as a bonding chamber. However, according to another embodiment, the bonding chamber has atmospheric pressure.

FIG. 21 illustrates a cross sectional view of the semiconductor device shown in FIG. 20 after a grinding process is applied to the semiconductor device in accordance with an embodiment. A grinding process is applied to the bottom side of the carrier 200 until the input and output pads 2102 and 2104 are exposed. The input and output pads 2102 and 2104 are electrically coupled to the integrated circuits of the CMOS device 300. In addition, the input and output pads 2102 and 2104 may further be coupled to external circuits (not shown).

FIGS. 22-44 illustrate intermediate steps of fabricating a MEMS device in accordance with another embodiment. The fabrication steps of the MEMS device and the carrier shown in FIGS. 22-34 are similar to the fabrication steps shown in FIGS. 2-14, and hence are not discussed again to avoid unnecessary repetition.

Figure 34:
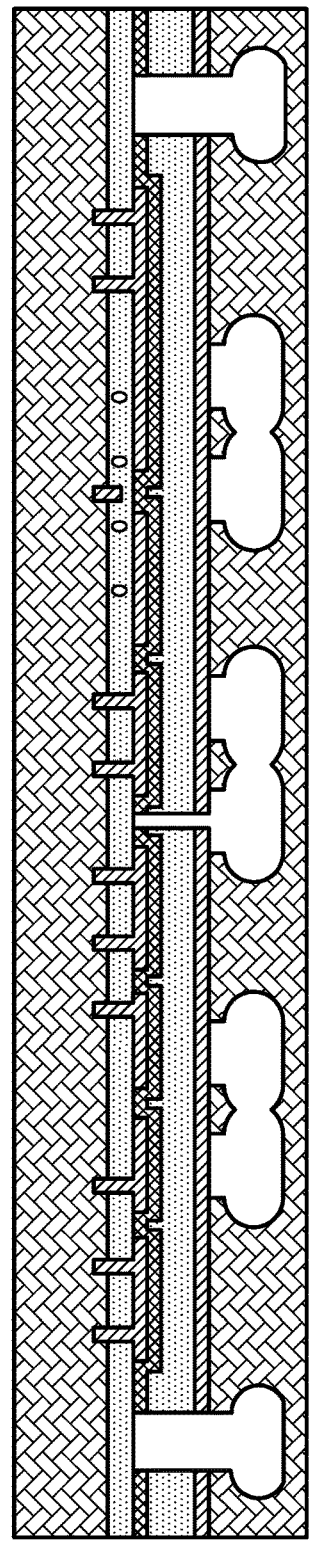
Figure 35:
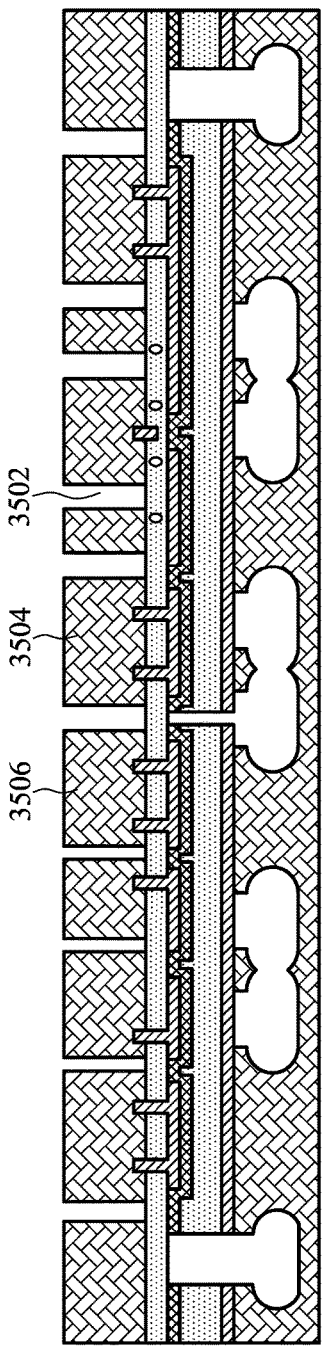

FIG. 35 illustrates a cross sectional view of the semiconductor device shown in FIG. 34 after a plurality of through openings are formed in the substrate of the MEMS device in accordance with an embodiment. A thinning process is performed on the top surface of the MEMS device. The grinding is performed until a desired thickness is achieved. In accordance with an embodiment, the MEMS device is of a thickness in a range from about 5 um to about 60 um.

An etch step is then performed to etch through substrate of the MEMS device to form through-openings 3502. The etch step may be performed using DRIE. Through-openings 3502 may physically and electrically isolate some portions (e.g., portion 3504) of substrate from other portions (e.g., portion 3506) of the substrate.

Figure 36:
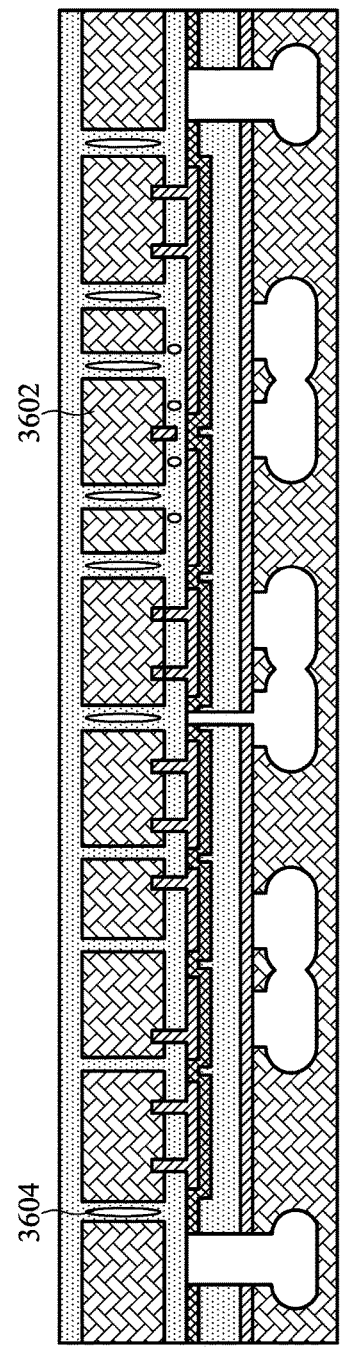

FIG. 36 illustrates a cross sectional view of the semiconductor device shown in FIG. 35 after an oxide deposition is applied to the semiconductor device in accordance with an embodiment. The oxide deposition may form a sacrificial oxide layer 3602. The sacrificial oxide layer 3602 can be formed by any suitable fabrication techniques such as CVD, LPTEOS, PECVD, HDPCVD and the like. It should be noted that the sacrificial oxide layer 3602 may be formed through multiple oxide deposition processes and their corresponding etch-back processes. In addition, as shown in FIG. 36, there may be an air opening 3604 formed in the sacrificial oxide layer 3602.

Figure 37:
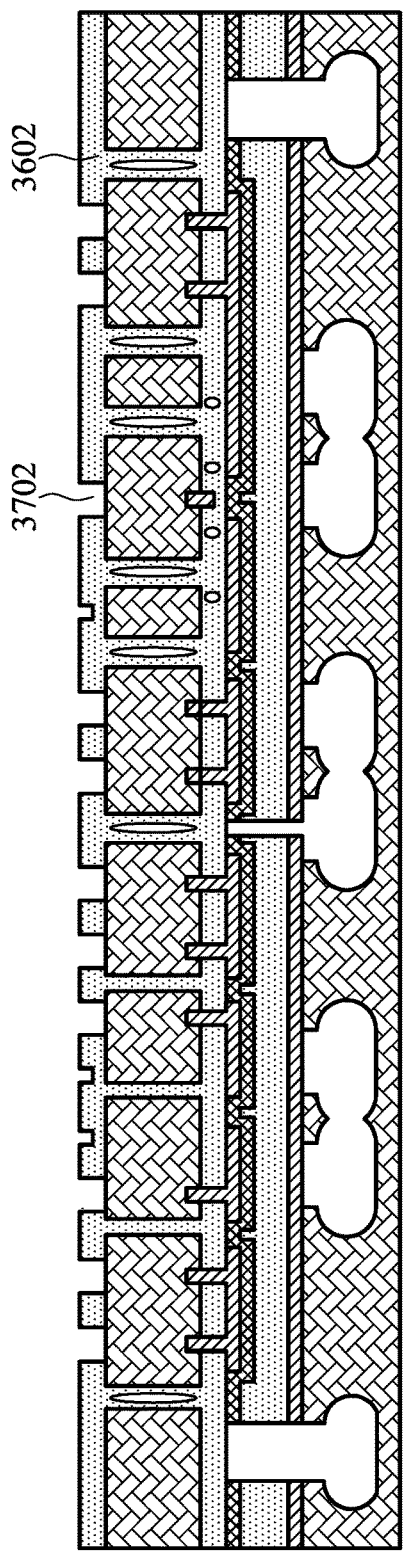

FIG. 37 illustrates a cross sectional view of the semiconductor device shown in FIG. 36 after a patterning process is applied to the sacrificial oxide layer in accordance with an embodiment. The patterning process is employed to form openings 3702 in the sacrificial oxide layer 3602. The patterning process may be accomplished by depositing a commonly used mask material (not shown) such as photoresist over the sacrificial oxide layer 3602. The mask material is then patterned and the sacrificial oxide layer 3602 is etched in accordance with the pattern to form the openings 3702.

Figure 38:
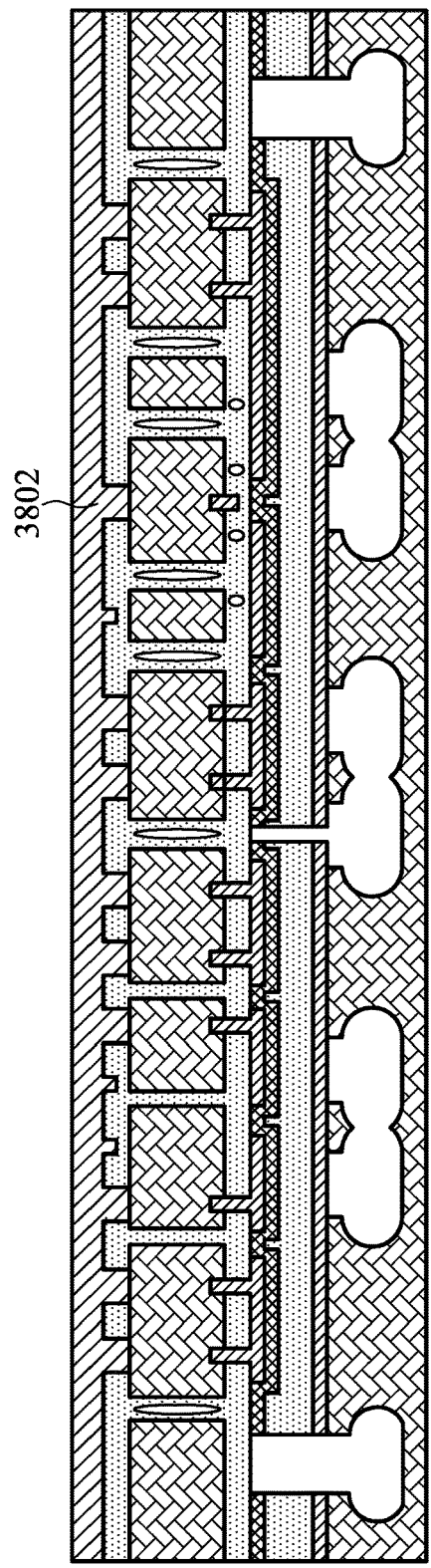

FIG. 38 illustrates a cross sectional view of the semiconductor device shown in FIG. 37 after a polysilicon layer is formed on the sacrificial oxide layer in accordance with an embodiment. A layer of polysilicon 3802 is formed over the structure, including within openings 3702 (not shown but illustrated in FIG. 37). As shown in FIG. 38, the polysilicon layer 3802 not only fills the openings 3702, it also covers the top surface of the MEMS device.

Figure 39:
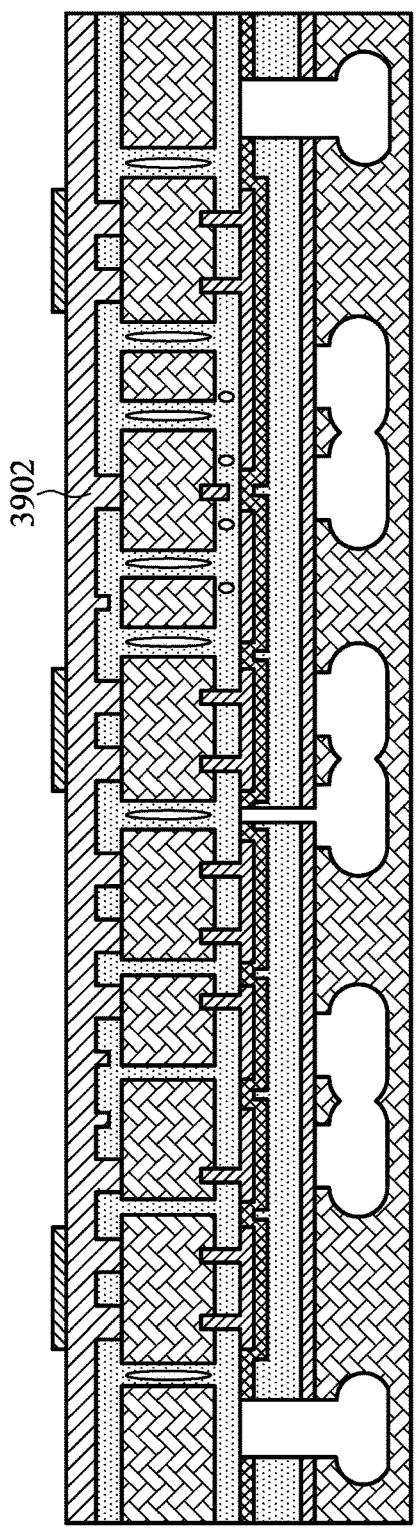

FIG. 39 illustrates the formation and patterning of a bonding material layer on top of the MEMS device in accordance with an embodiment. The bonding material layer 3902 may be made of aluminum copper, germanium, gold, the like, or a combination thereof. The bonding material 3902 may be formed using PVD and the like. The bonding material 3902 may be patterned using acceptable lithography techniques.

Figure 40:
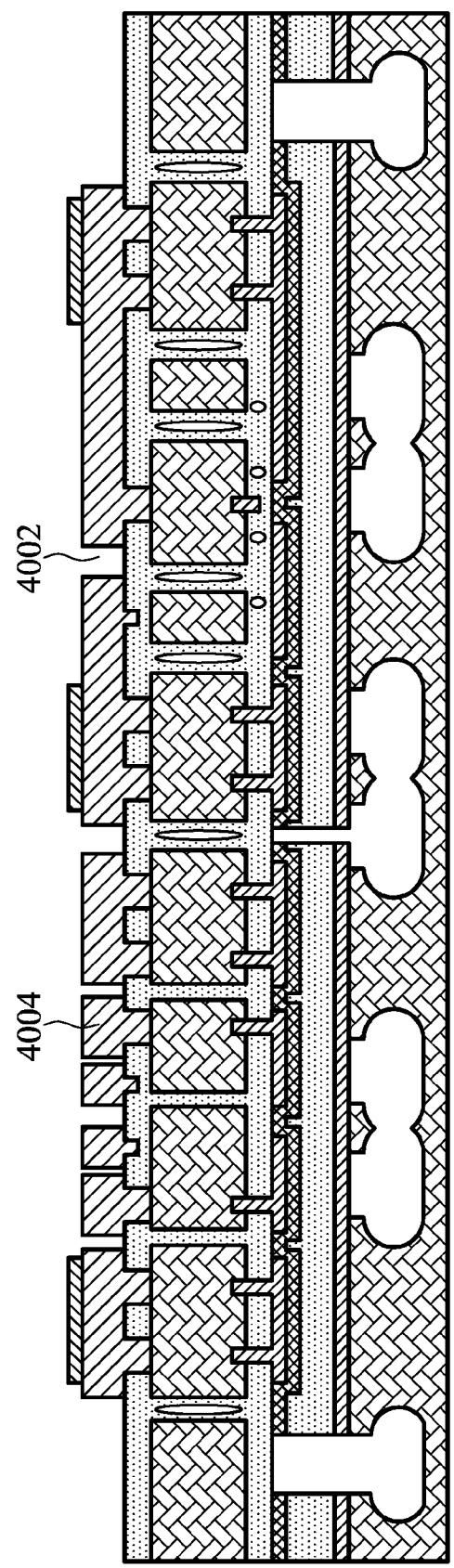

FIG. 40 illustrates a cross sectional view of the semiconductor device shown in FIG. 39 after an etching process is applied to the polysilicon layer in accordance with an embodiment. A patterning process is applied to the polysilicon layer 3802 (shown in FIG. 38) by depositing a commonly used mask material (not shown) such as photoresist. The mask material is then patterned and the polysilicon layer 3802 is etched back to remove portions of polysilicon layer 3802 overlying the MEMS device, while leaving polysilicon plugs, such as plug 4004 and openings 4002.

Figure 41:
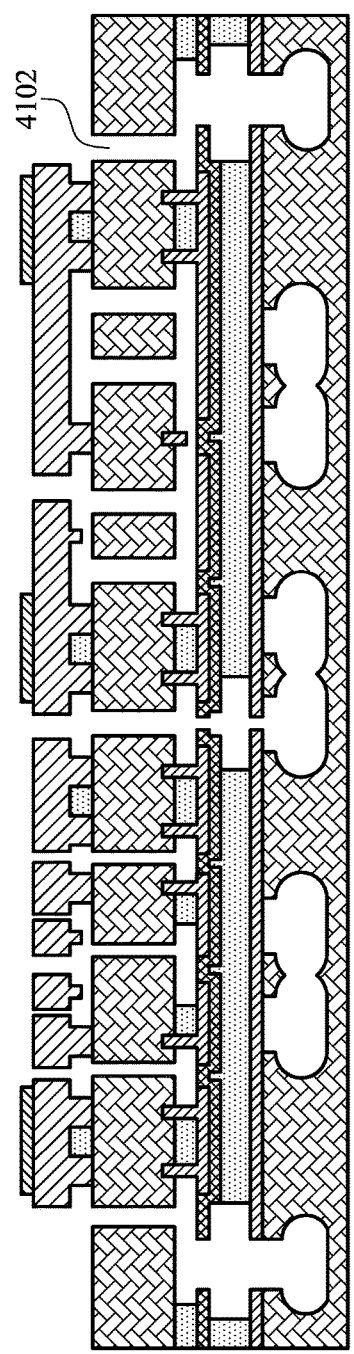

FIG. 41 illustrates a cross sectional view of the semiconductor device shown in FIG. 40 after a vapor HF process is applied to the sacrificial oxide layer in accordance with an embodiment. The fabrication step of FIG. 41 is similar to the fabrication step described above with respect to FIG. 17, and hence is not discussed in further detail to avoid unnecessary repetition.

Figure 42:
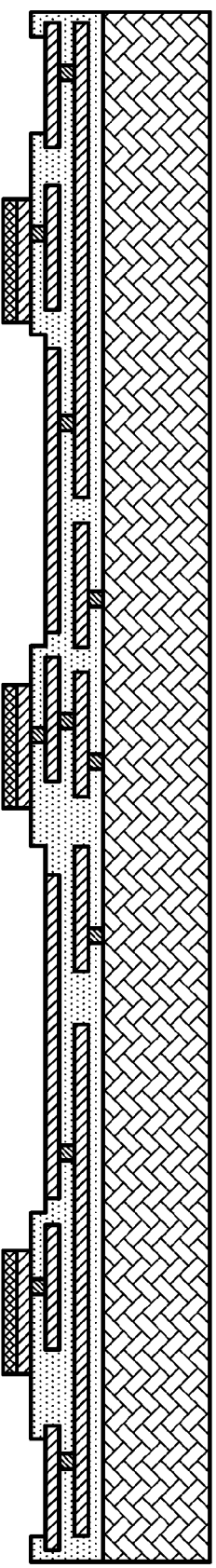
Figure 43:
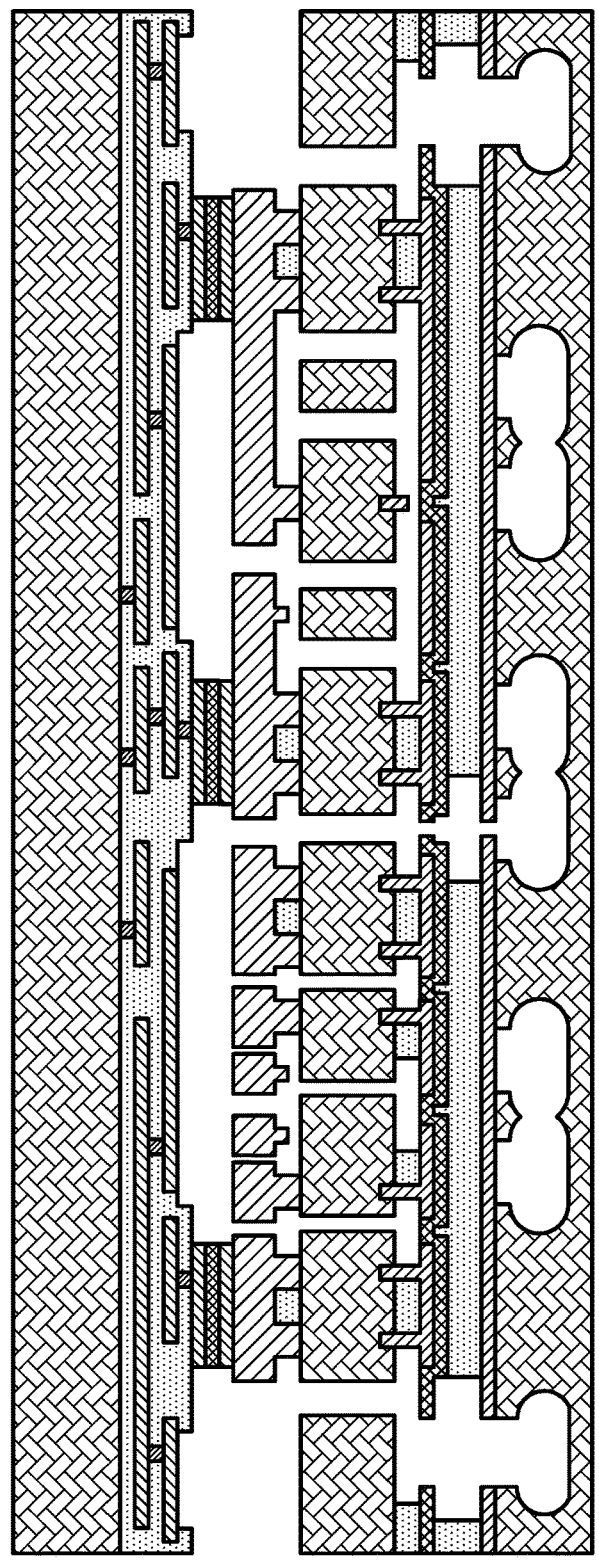
Figure 44:
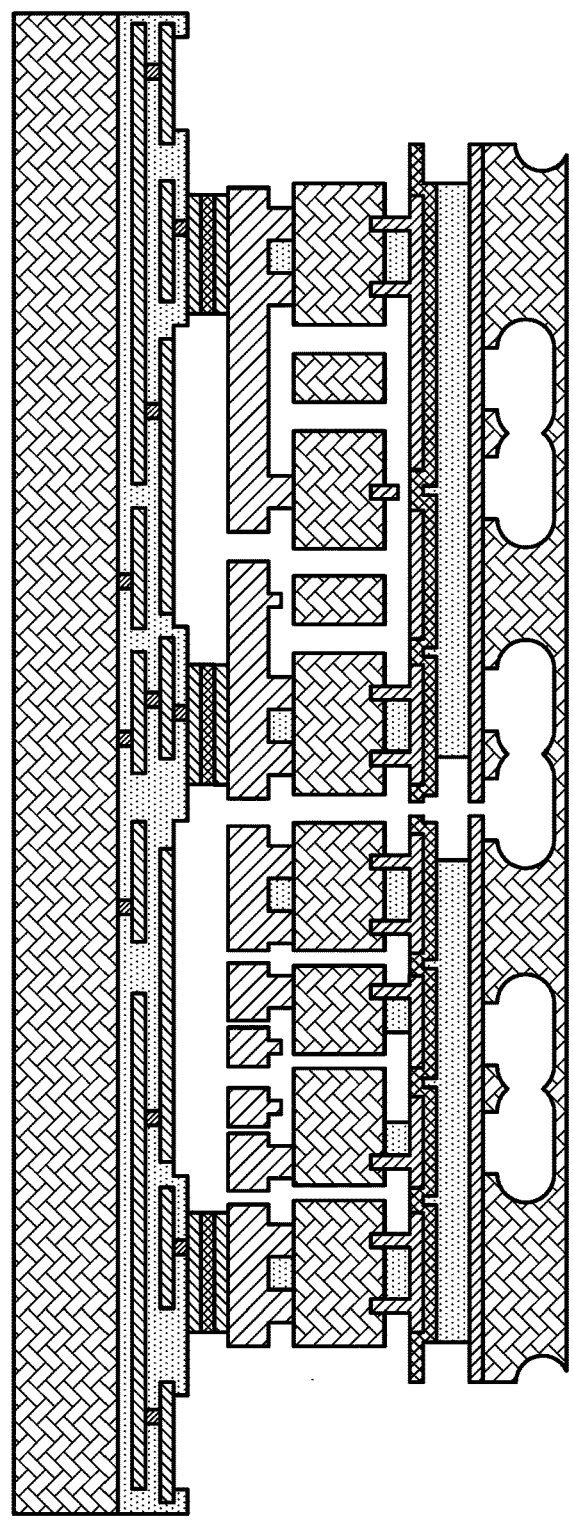

FIGS. 42-44 illustrate intermediate steps of bonding a CMOS device on top of the MEMS device in accordance with an embodiment. The steps of bonding the CMOS device on top of the MEMS device are similar to those described above with respect FIGS. 18-20, and hence are not discussed again herein.

FIGS. 45-52 illustrate intermediate steps of fabricating a MEMS device in accordance with another embodiment. The fabrication steps illustrated in FIGS. 45-52 are applicable to other semiconductor structures such as forming interconnects of the MEMS device including electrical readouts and the like.

Figure 32:
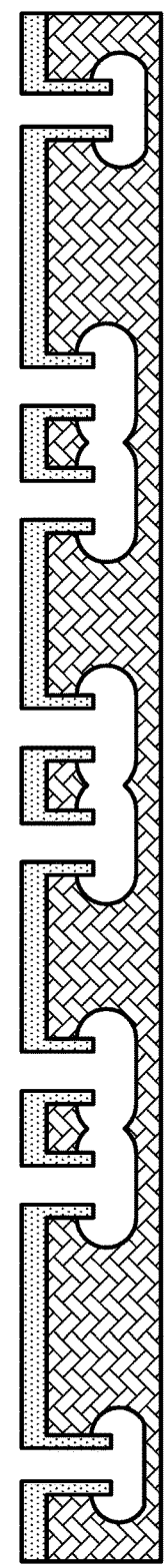
Figure 33:
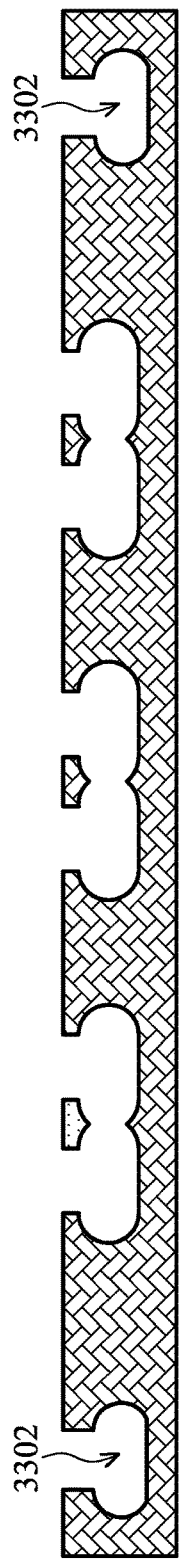
Figure 45:
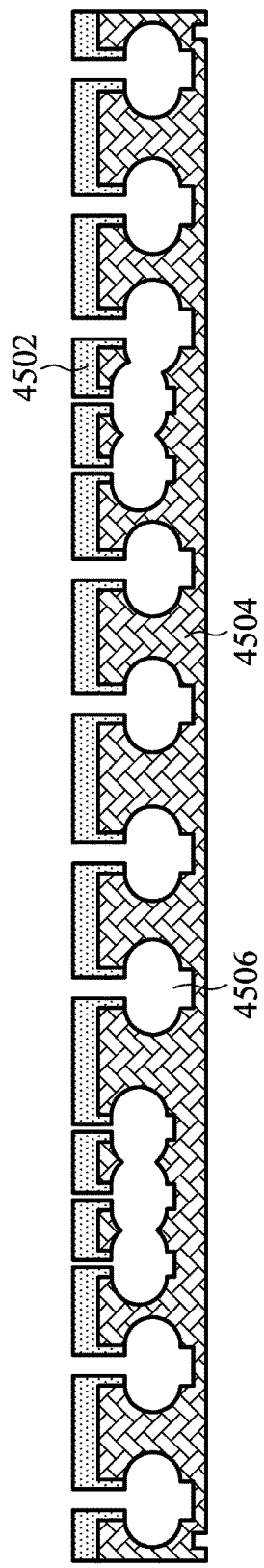
FIGS. 45-52 illustrate intermediate steps of fabricating a MEMS device in accordance with another embodiment.

FIG. 45 illustrates a cross sectional view of a semiconductor device similar to the semiconductor devices shown in FIG. 12 and FIG. 32 after a further anisotropic etching process is applied to a carrier in accordance with some embodiments. The carrier 4502 shown in FIG. 45 is similar to the carrier 200 shown in FIG. 1A. The substrate 4504 of the carrier 4502 may be formed of the same material as the substrate 902 shown in FIG. 9. In accordance with an embodiment, the substrate 4504 is a low resistive silicon substrate.

As shown in FIG. 45, portions of the substrate 4504 are removed to form trench and via extrusions over cavities 4506. An etching process, such as a reactive ion etch (RIE) or other dry etch, an anisotropic wet etch, or any other suitable anisotropic etch or patterning process, may be performed to form the trench and via extrusions over the cavities 4506. The trench and via extrusions are used to form electrical readout interconnects for the MEMS device, which will be described below with respect to FIG. 52.

Figure 46:
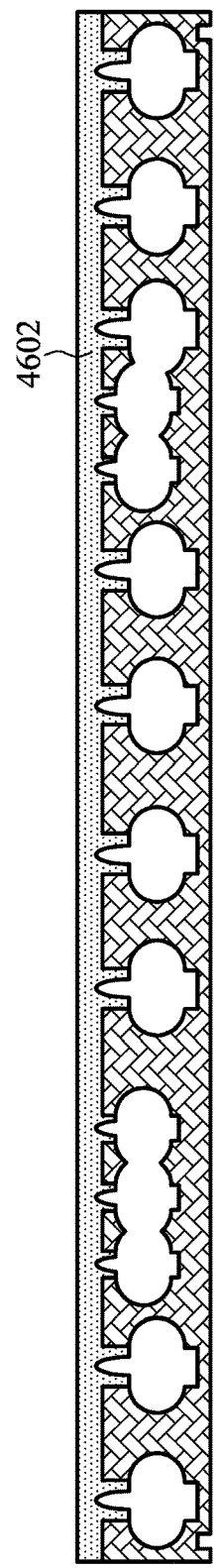

FIG. 46 illustrates a cross sectional view of the semiconductor device after the trench and via openings shown in FIG. 45 are sealed by a dielectric layer in accordance with an embodiment. The dielectric layer 4602 may be formed, for example, of a low-K dielectric material, such as silicon oxide. In accordance with an embodiment, the dielectric layer may be an oxide layer formed by suitable semiconductor fabrication techniques such as a CVD process and the like.

Figure 47:
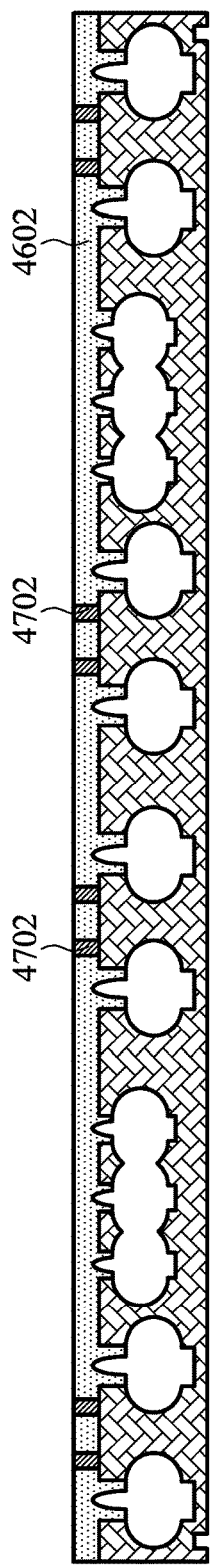

FIG. 47 illustrates a cross sectional view of the semiconductor device shown in FIG. 46 after forming contact vias in the dielectric layer in accordance with an embodiment. A plurality of contact vias 4702 may be formed in the dielectric layer 4602 through a patterning process. The contact vias may be formed of suitable metal materials such as tungsten and the like.

Figure 48:
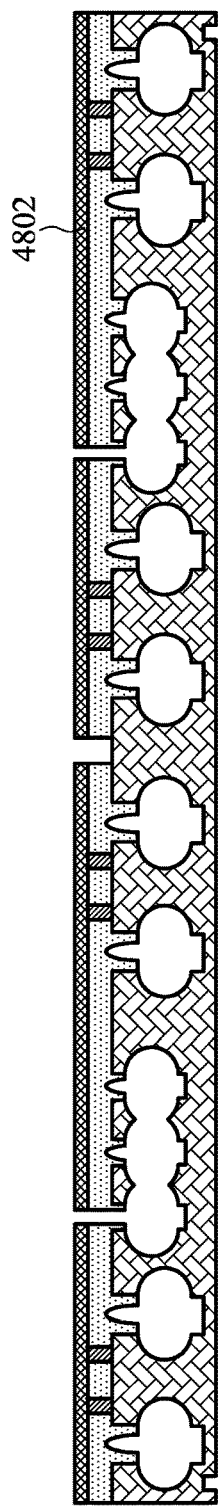

FIG. 48 illustrates a cross sectional view of the semiconductor device shown in FIG. 47 after depositing and patterning a bonding layer on the oxide and the contact vias in accordance with an embodiment. The bonding layer 4802 may be formed of germanium and the like. The bonding layer 4802 is patterned to expose cavities for pressure reduction.

Figure 49:
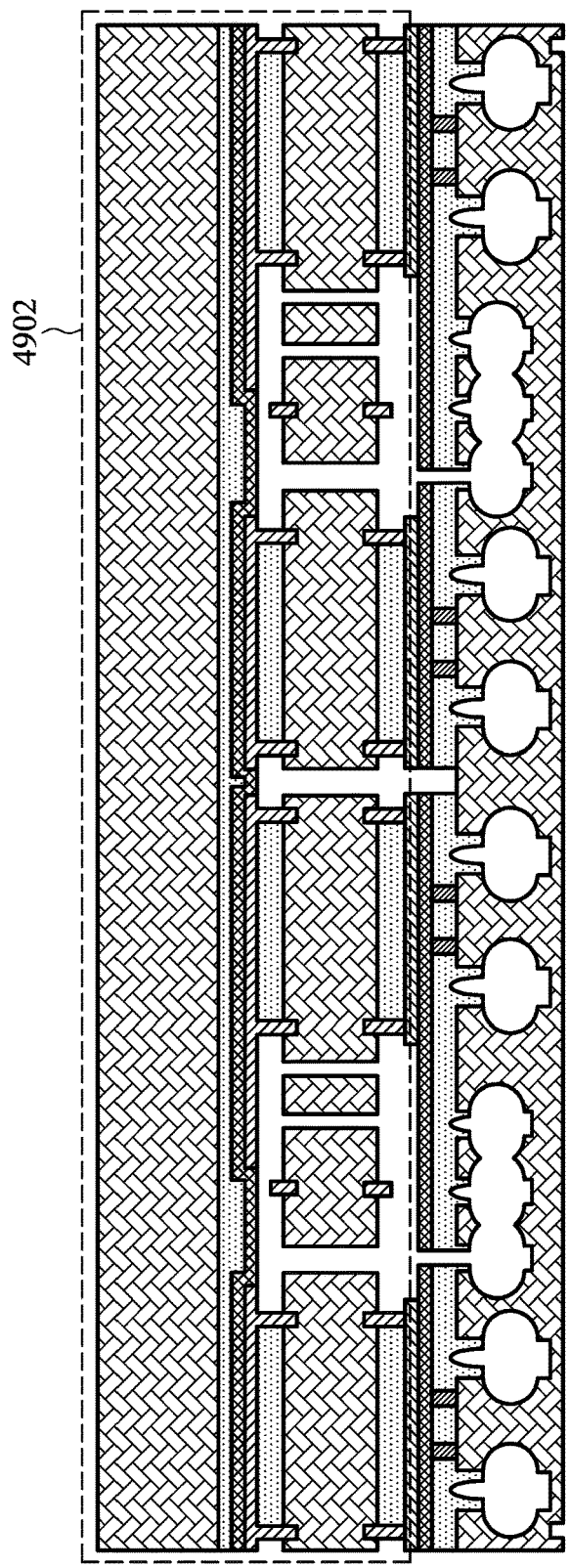

FIG. 49 illustrates a cross sectional view of the semiconductor device after a MEMS device is bonded on top of the semiconductor device shown in FIG. 48 in accordance with an embodiment. Before a bonding process is applied to the MEMS device and the semiconductor device, a bonding layer comprising suitable bonding materials such as aluminum copper may be deposited and patterned on the MEMS device 4902. Through a suitable bonding process such as a eutectic bonding process, a conductive bonding interface is established between the semiconductor device and the MEMS device 4902. For example, the bonding interface may comprise a eutectic alloy formed by a eutectic bonding reaction between a first bonding layer comprising germanium and a second bonding layer comprising an aluminum copper alloy.

Figure 50:
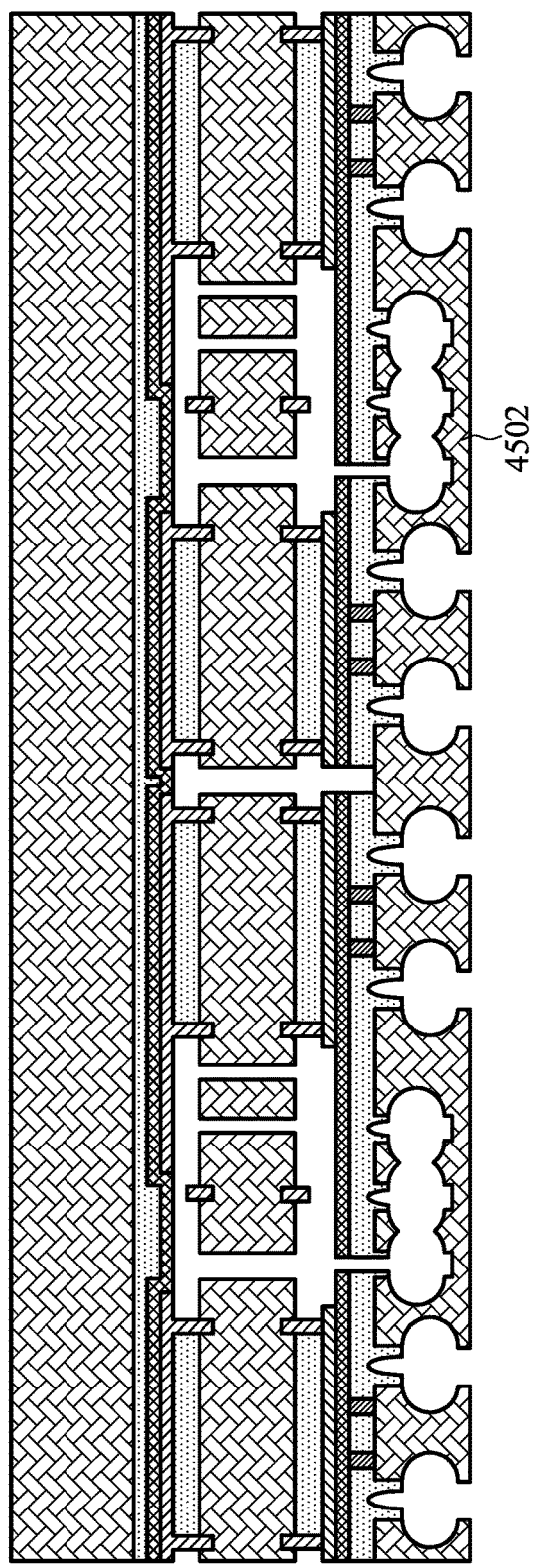

FIG. 50 illustrates a cross sectional view of the semiconductor device shown in FIG. 49 after a grinding process is applied to the semiconductor device in accordance with an embodiment. A grinding process is applied to the non-bonding side of the carrier 4502 until the trench and via extrusions are exposed. The grinding process may be implemented by suitable grinding techniques including silicon grinding, chemical mechanical polishing, etching and the like.

Figure 51:
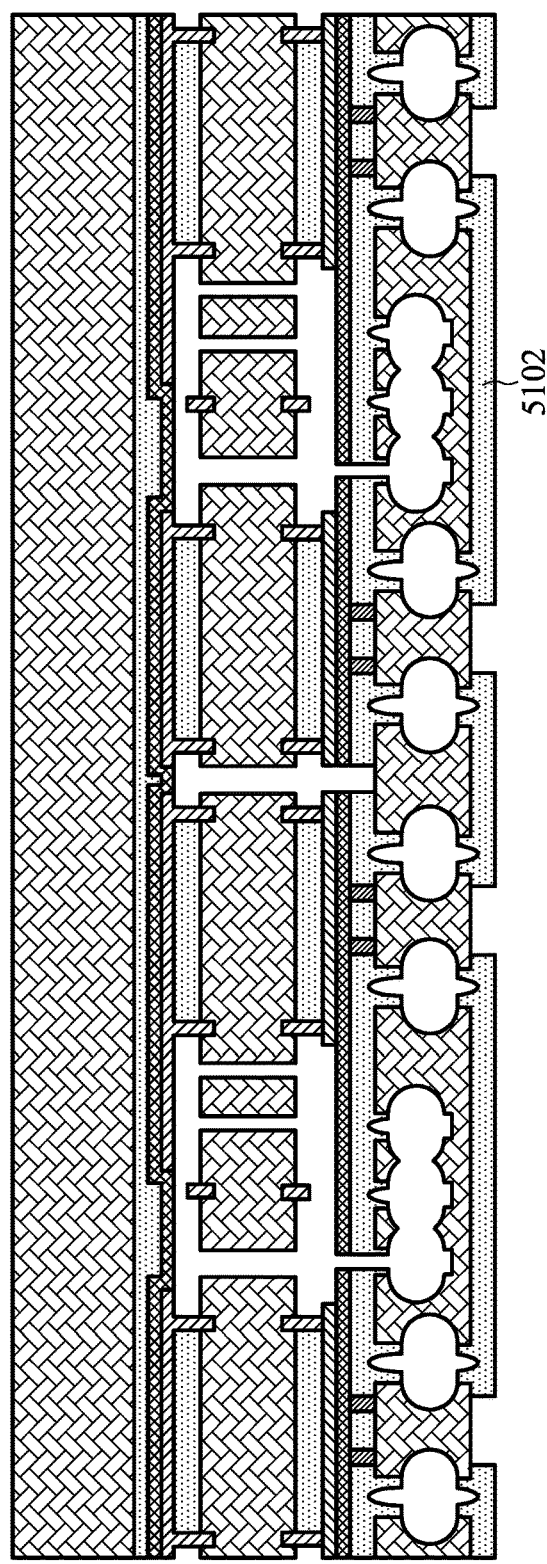

FIG. 51 illustrates a cross sectional view of the semiconductor device shown in FIG. 50 after sealing the trench and via openings with a dielectric layer and patterning the dielectric layer to form contact-to-silicon vias in accordance with an embodiment. The dielectric layer 5102 may be an oxide layer. The oxide layer may be suitable semiconductor fabrication techniques such as CVD and the like.

Figure 52:
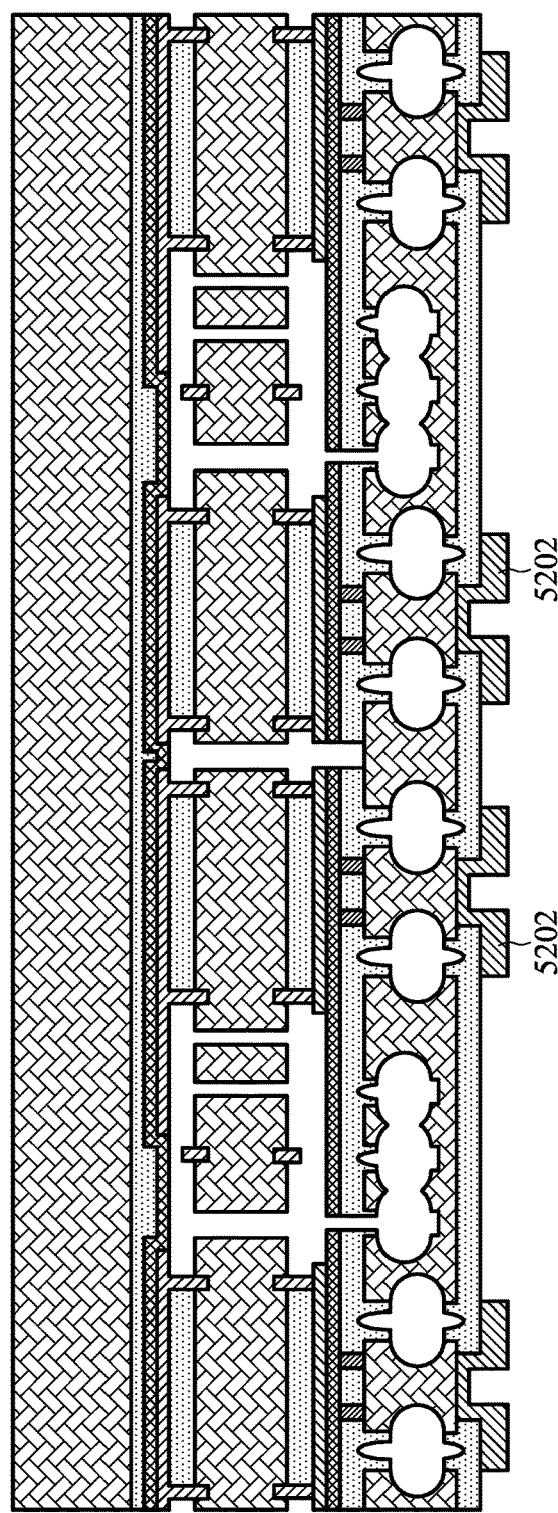

FIG. 52 illustrates a cross sectional view of the semiconductor device shown in FIG. 51 after electrical readout structures are formed over the non-bonding side of the carrier in accordance with an embodiment. Conductive materials such as an aluminum copper alloy are deposited on the non-bonding side of the carrier through suitable deposition processes such as CVD, PVD and the like. The conductive material layer is further patterned to form electrical readout structures 5202 as shown in FIG. 52.

Figure 53:
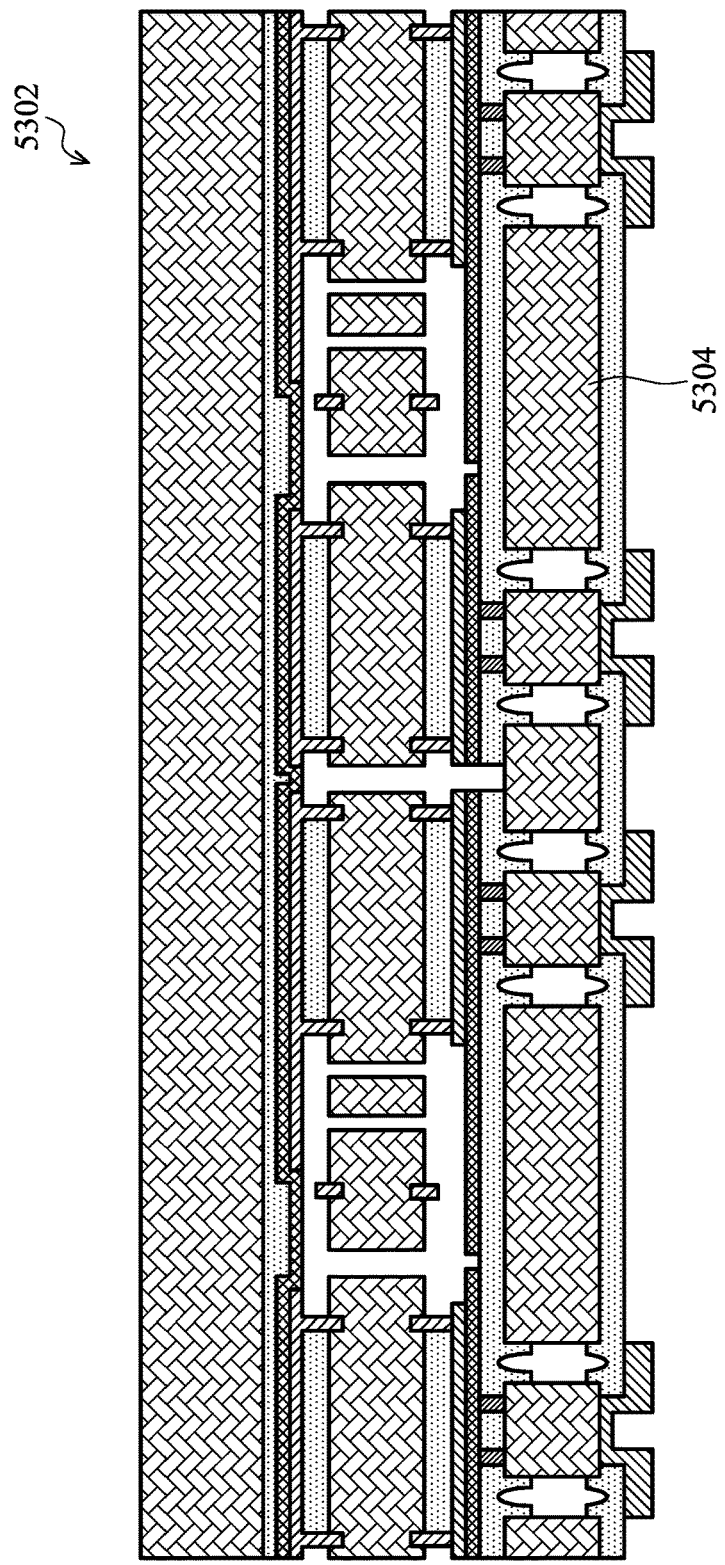
FIG. 53 illustrates a cross sectional view of a semiconductor device in accordance with another embodiment.

FIG. 53 illustrates a cross sectional view of a semiconductor device in accordance with another embodiment. The structure of the semiconductor device 5302 is similar to the semiconductor device shown in FIG. 52 except that the substrate 5304 of the semiconductor device 5302 does not include cavities. In other words, the isotropic etching process illustrated in FIG. 12 is not applied to the substrate 5304. Other fabrication steps for forming the semiconductor device 5302 shown in FIG. 53 are similar to those described above with respect to FIGS. 46-52, and hence are not discussed again herein.

Figure 54:
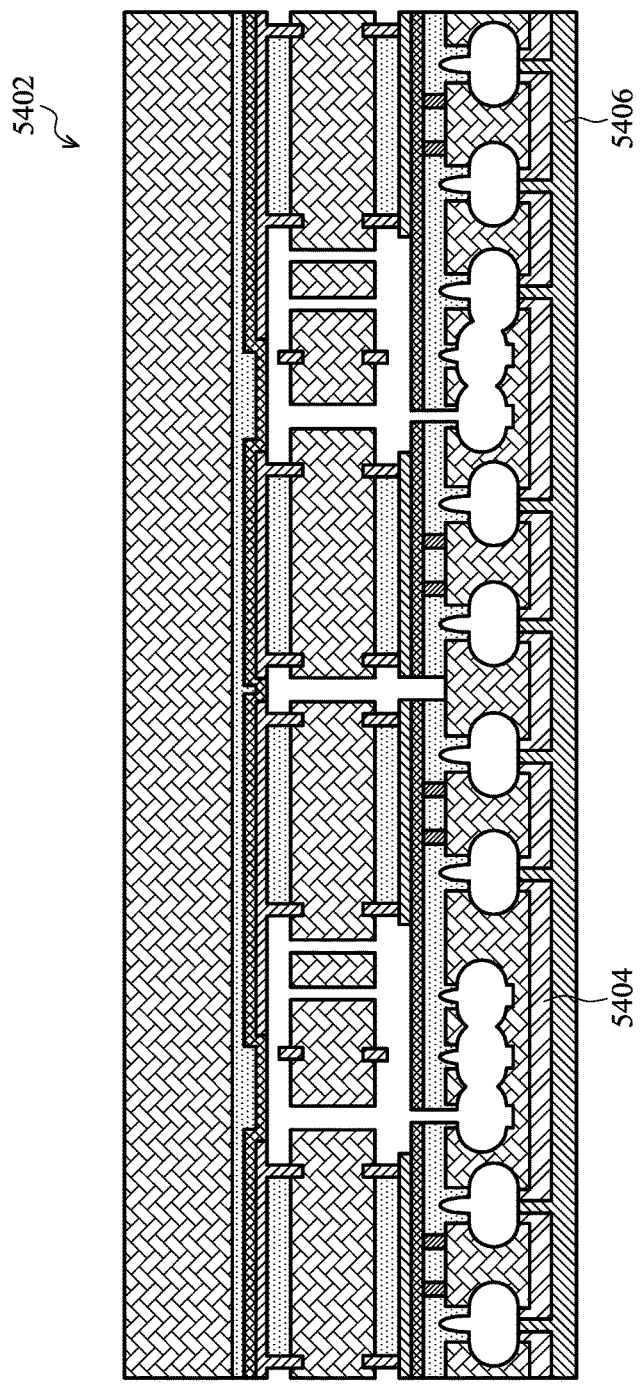
FIG. 54 illustrates a cross sectional view of a semiconductor device in accordance with yet another embodiment.

FIG. 54 illustrates a cross sectional view of a semiconductor device in accordance with yet another embodiment. The structure of the semiconductor device 5402 is similar to the semiconductor device shown in FIG. 51 except that the trench and via openings are sealed by an oxide layer 5404 and an aluminum copper layer 5406.

Figure 55:
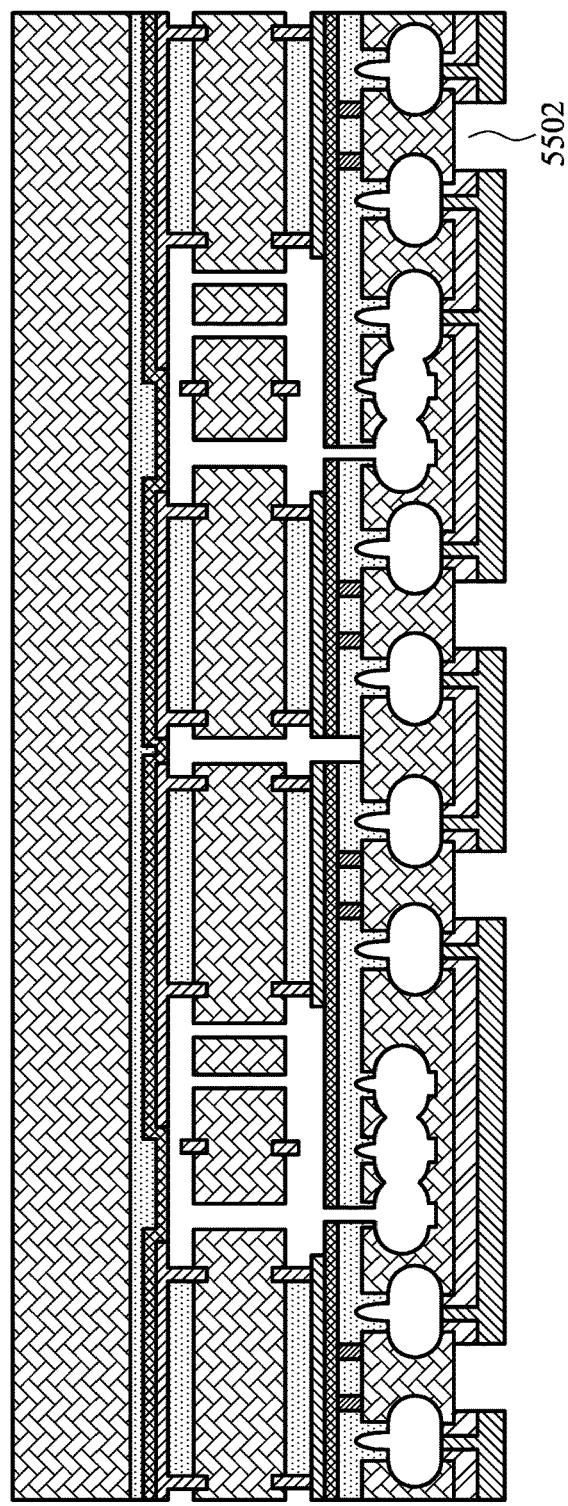
FIG. 55 illustrates a cross sectional view of the semiconductor device shown in FIG. 54 after a patterning process is applied to the non-bonding side of the carrier in accordance with an embodiment.

FIG. 55 illustrates a cross sectional view of the semiconductor device shown in FIG. 54 after a patterning process is applied to the non-bonding side of the carrier in accordance with an embodiment. A patterning process is applied to the oxide layer 5404 as well as the aluminum copper layer 5406 to form contact-to-silicon vias 5502.

Figure 56:
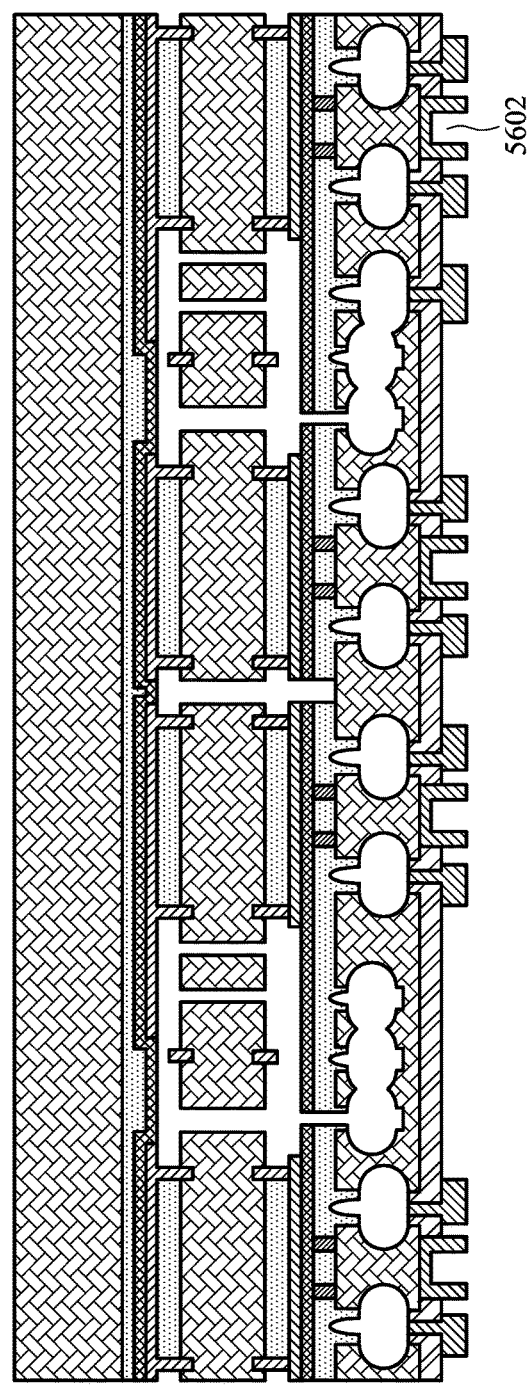
FIG. 56 illustrates a cross sectional view of the semiconductor device shown in FIG. 55 after a conductive material is deposited to form electrical readout structures in accordance with an embodiment.

FIG. 56 illustrates a cross sectional view of the semiconductor device shown in FIG. 55 after a conductive material is deposited to form electrical readout structures in accordance with an embodiment. Conductive materials such as aluminum copper may be deposited on the contact-to-silicon vias 5502 to form electrical readout structures 5602 of the MEMS device.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a carrier having a plurality of cavities;
   a micro-electro-mechanical system (MEMS) substrate bonded on the carrier, wherein the MEMS substrate comprises:
   a first side bonded on the carrier;
   a first moving element over a bottom electrode, wherein the bottom electrode is formed of polysilicon; and
   a second side having a plurality of bonding pads; and
   a semiconductor substrate bonded on the MEMS substrate, wherein the semiconductor substrate comprises a top electrode, and wherein the first moving element is between the top electrode and the bottom electrode.

2. The semiconductor device of claim 1, wherein:
   the MEMS substrate comprises a plurality of air channels coupled to the cavities of the carrier.

3. The semiconductor device of claim 1, wherein:
   each cavity of the plurality of cavities comprises an extrusion.

4. The semiconductor device of claim 1, further comprising:
   a first dielectric layer deposited on the first side of the MEMS substrate;
   a vapor HF stop layer formed over the first dielectric layer;
   a second dielectric layer formed over the vapor HF stop layer; and
   a bonding layer formed over the second dielectric layer.

5. The semiconductor device of claim 4, where:
   the first dielectric layer is a first oxide layer;
   the vapor HF stop layer is a low stress nitride layer;
   the second dielectric layer is a second oxide layer; and
   the bonding layer is formed of polysilicon.

6. The semiconductor device of claim 1, further comprising:
   a bonding material layer on the semiconductor substrate, wherein the bonding material layer is conductive.

7. The semiconductor device of claim 1, further comprising:
   a conductive layer formed between the semiconductor substrate and the MEMS substrate, wherein the conductive layer is thinner than the MEMS substrate.

8. The semiconductor device of claim 1, further comprising:
   an anchor region formed adjacent to the first side of the MEMS device, and wherein three sides of the anchor region are wrapped by a polysilicon layer.

9. The semiconductor device of claim 1, further comprising:
   a mechanical bump partially embedded in a second moving element.

10. The semiconductor device of claim 9, wherein:
    the mechanical bump is formed of polysilicon.

11. An apparatus comprising:
    a carrier having a plurality of cavities;
    a micro-electro-mechanical system (MEMS) device bonded on the carrier, wherein the MEMS device comprises:
    a first side bonded on the carrier;
    a moving element over a bottom electrode;
    an anchor region formed adjacent to the first side of the MEMS device, and wherein three sides of the anchor region are wrapped by a polysilicon layer; and
    a second side having a plurality of bonding pads; and
    a semiconductor substrate bonded on the MEMS device, wherein the semiconductor substrate comprises a top electrode, and wherein the moving element is between the top electrode and the bottom electrode.

12. The apparatus of claim 11, wherein:
    the bottom electrode is formed of polysilicon.

13. The apparatus of claim 11, wherein:
    a first side of the anchor region is in contact with a substrate of the MEMS device; and
    a second side and sidewalls of the anchor region is in contact with the polysilicon layer.

14. The apparatus of claim 11, further comprising:
    a bonding interface layer in contact with the carrier, wherein:
    the bonding interface layer covers at least one of the plurality of cavities; and
    the bonding interface layer and the bottom electrode are separated by at least one dielectric layer.

15. The apparatus of claim 14, wherein:
    the bonding interface layer is formed of polysilicon.

16. A device comprising:
    a carrier having a plurality of cavities, wherein a first opening of a first cavity is covered by a bonding interface layer and a second opening of the first cavity is exposed through a gap between two adjacent bonding interface layers;
    a micro-electro-mechanical system (MEMS) device bonded on the carrier, wherein the MEMS device comprises:
    the bonding interface layer on a first side of the MEMS device;
    a dielectric layer on the bonding interface layer;
    a bottom electrode over the dielectric layer;
    a first moving element over the bottom electrode; and
    a semiconductor substrate bonded on a second side of the MEMS substrate, wherein the semiconductor substrate comprises a top electrode, and wherein the first moving element is between the bottom electrode and the top electrode.

17. The device of claim 16, wherein:
    the bottom electrode is formed of polysilicon.

18. The device of claim 16, further comprising:
    an anchor region formed over the bottom electrode, and wherein three sides of the anchor region are wrapped by a polysilicon layer.

19. The device of claim 16, further comprising:
    a second moving element between the bottom electrode and the top electrode, wherein a mechanical bump is partially embedded in the second moving element, and wherein the mechanical bump is formed of polysilicon.

20. The device of claim 16, further comprising:
    a polysilicon layer formed between the top electrode and the first moving element.

* * * * *